United States Patent
Lim et al.

(10) Patent No.: US 11,495,495 B2
(45) Date of Patent: Nov. 8, 2022

(54) METHOD OF MANUFACTURING SEMICONDUCTOR DEVICE HAVING A STRUCTURE PATTERN HAVING A PLURALITY OF TRENCHES

(71) Applicant: SAMSUNG ELECTRONICS CO., LTD., Suwon-si (KR)

(72) Inventors: Geun-Won Lim, Yongin-si (KR); Myung-Keun Lee, Seoul (KR); Seok-Cheon Baek, Hwaseong-si (KR); Kyeong-Jin Park, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 208 days.

(21) Appl. No.: 17/061,549

(22) Filed: Oct. 1, 2020

(65) Prior Publication Data

US 2021/0020510 A1    Jan. 21, 2021

Related U.S. Application Data

(63) Continuation of application No. 16/164,347, filed on Oct. 18, 2018, now Pat. No. 10,818,547.

(30) Foreign Application Priority Data

Apr. 23, 2018  (KR) .................. 10-2018-0046983

(51) Int. Cl.
  *H01L 21/768* (2006.01)
  *H01L 21/02* (2006.01)
  (Continued)

(52) U.S. Cl.
  CPC .. *H01L 21/76897* (2013.01); *H01L 21/02532* (2013.01); *H01L 21/02595* (2013.01);
  (Continued)

(58) Field of Classification Search
  CPC ........... H01L 27/11582; H01L 45/1226; H01L 27/249; H01L 27/11556; H01L 27/1157; H01L 27/2454; H01L 45/06; H01L 45/144
  See application file for complete search history.

(56) References Cited

U.S. PATENT DOCUMENTS

| | | | |
|---|---|---|---|
| 6,440,801 B1 * | 8/2002 | Furukawa | H01L 27/115 257/302 |
| 8,120,006 B2 * | 2/2012 | Kim | H01L 45/144 257/296 |

(Continued)

FOREIGN PATENT DOCUMENTS

| KR | 10-2011-0002436 | 1/2011 |
|---|---|---|
| KR | 10-2016-0020019 | 2/2016 |

*Primary Examiner* — Jaehwan Oh
(74) *Attorney, Agent, or Firm* — F. Chau & Associates, LLC

(57) ABSTRACT

A method of manufacturing a semiconductor device includes forming a base layer on a substrate. A structure layer is Conned on the base layer. The structure layer includes at least one material layer. A structure pattern is formed on the base layer. The structure pattern includes a first trench extending in a first direction and a second trench having a cross portion extending in a second direction that is perpendicular to the first direction. The second trench is connected to the first trench. The structure pattern further includes a base pattern having a recess portion recessed downward from a surface of the base layer at the cross portion of the second trench.

20 Claims, 30 Drawing Sheets

(51) Int. Cl.
    *H01L 29/10*     (2006.01)
    *H01L 27/1157*     (2017.01)
    *H01L 27/11573*     (2017.01)
    *H01L 27/11582*     (2017.01)
    *H01L 21/311*     (2006.01)
    *H01L 21/033*     (2006.01)
    *H01L 21/027*     (2006.01)

(52) U.S. Cl.
    CPC .. *H01L 21/76805* (2013.01); *H01L 21/76877* (2013.01); *H01L 21/76895* (2013.01); *H01L 27/1157* (2013.01); *H01L 27/11573* (2013.01); *H01L 27/11582* (2013.01); *H01L 29/1037* (2013.01); *H01L 21/0274* (2013.01); *H01L 21/0332* (2013.01); *H01L 21/31144* (2013.01)

(56) References Cited

U.S. PATENT DOCUMENTS

| | | | |
|---|---|---|---|
| 8,456,909 B2 | 6/2013 | Lee et al. | |
| 8,569,734 B2* | 10/2013 | Redaelli | H01L 45/12 257/209 |
| 8,748,971 B2 | 6/2014 | Tanaka et al. | |
| 8,847,302 B2* | 9/2014 | Alsmeier | H01L 29/512 257/390 |
| 9,012,326 B2 | 4/2015 | Kim et al. | |
| 9,136,471 B2* | 9/2015 | Redaelli | H01L 45/1226 |
| 9,299,717 B2 | 3/2016 | Lee et al. | |
| 9,331,088 B2* | 5/2016 | Takaki | H01L 29/66833 |
| 9,412,941 B2 | 8/2016 | Zhanderighi et al. | |
| 9,536,897 B2 | 1/2017 | Yoo et al. | |
| 9,564,451 B1 | 2/2017 | Shin et al. | |
| 9,589,981 B2* | 3/2017 | Nishikawa | H01L 21/76877 |
| 9,646,981 B2* | 5/2017 | Nishikawa | H01L 28/20 |
| 9,735,354 B2* | 8/2017 | Redaelli | H01L 45/06 |
| 9,818,693 B2 | 11/2017 | Toyama et al. | |
| 10,354,956 B1* | 7/2019 | Yu | H01L 21/76846 |
| 10,418,418 B2* | 9/2019 | Murakami | H01L 27/249 |
| 2012/0147649 A1* | 6/2012 | Samachisa | H01L 27/249 257/E21.645 |
| 2013/0210211 A1* | 8/2013 | Vereen | H01L 45/1226 438/382 |
| 2014/0048763 A1* | 2/2014 | Redaelli | H01L 45/12 438/132 |
| 2015/0279850 A1* | 10/2015 | Takaki | H01L 29/66825 257/369 |
| 2016/0104719 A1* | 4/2016 | Jung | H01L 27/1157 257/324 |
| 2016/0365351 A1* | 12/2016 | Nishikawa | H01L 27/11556 |
| 2017/0352671 A1* | 12/2017 | Kato | H01L 29/512 |
| 2018/0269256 A1* | 9/2018 | Murakami | H01L 27/249 |
| 2019/0326169 A1 | 10/2019 | Lim et al. | |

* cited by examiner

METHOD OF MANUFACTURING SEMICONDUCTOR DEVICE HAVING A STRUCTURE PATTERN HAVING A PLURALITY OF TRENCHES

CROSS-REFERENCE TO RELATED APPLICATION

The present application is a Continuation of co-pending U.S. patent application Ser. No. 16/164,347, filed on Oct. 18, 2018, which claims the benefit of and priority to Korean Patent Application No. 10-2018-0046983, filed on Apr. 23, 2018, in the Korean Intellectual Property Office, the disclosure of which is herein incorporated by reference in its entirety.

TECHNICAL FIELD

The present disclosure relates to a method of manufacturing a semiconductor device, and more particularly, to a method of manufacturing a semiconductor device including a structure pattern having a plurality of trenches.

DISCUSSION OF THE RELATED ART

In fabricating semiconductor devices, one or more material layers may be formed on a substrate. Structure patterns of various forms or sizes may be formed by patterning the material layers. Trenches of various shapes or sizes are formed in the structure patterns so that the structure patterns may be physically or electrically separated.

SUMMARY

A method of manufacturing a semiconductor device includes forming a base layer on a substrate. A structure layer is formed on the base layer. The structure layer includes at least one material layer. A structure pattern is formed on the base layer. The structure pattern includes a first trench extending in a first direction and a second trench having a cross portion extending in a second direction that is perpendicular to the first direction. The second trench is connected to the first trench. The structure pattern further includes a base pattern having a recess portion recessed downward from a surface of the base layer at the cross portion of the second trench.

A method of manufacturing a semiconductor device includes forming a base layer on a lower wiring structure including a lower wiring layer. A structure layer is formed on the base layer. The structure layer includes at least one insulating layer. A structure pattern including a first trench, a second trench, and a base pattern is formed. The first trench extends in a first direction on the lower wiring structure. The second trench has a cross portion connected to the first trench in a second direction perpendicular to the first direction. The base pattern has a penetration portion that at least partially penetrates the base layer at the cross portion. An upper wiring structure including a contact plug and an upper wiring layer is formed. The contact plug is connected to the lower wiring layer through the penetration portion and the upper wiring layer is buried in the first trench and is connected to the contact plug.

A method of manufacturing a semiconductor device includes forming a base layer on a substrate. A structure layer is formed by alternately stacking an interlayer insulating layer and a sacrificial layer on the base layer in a third direction perpendicular to the substrate. A channel structure is formed in a channel hole in the structure layer. A structure pattern including a first trench, a second trench, and a base pattern is formed. The first trench extends on the substrate in a first direction perpendicular to the third direction. The second trench has a cross portion connected to the first trench on the substrate in a second direction perpendicular to the first direction at one side of each of the interlayer insulating layer, the sacrificial layer, and the base layer. The base pattern includes a penetration portion that at least partially penetrates the base layer at the cross portion. A gap is formed by removing the sacrificial layer in the structure pattern. A plurality of word lines is formed in the gap in the structure pattern.

BRIEF DESCRIPTION OF THE DRAWINGS

A more complete appreciation of the present disclosure and many of the attendant aspects thereof will be readily obtained as the same becomes better understood by reference to the following detailed description taken in conjunction with the accompanying drawings in which.

DETAILED DESCRIPTION OF THE EMBODIMENTS

Figure 1A:
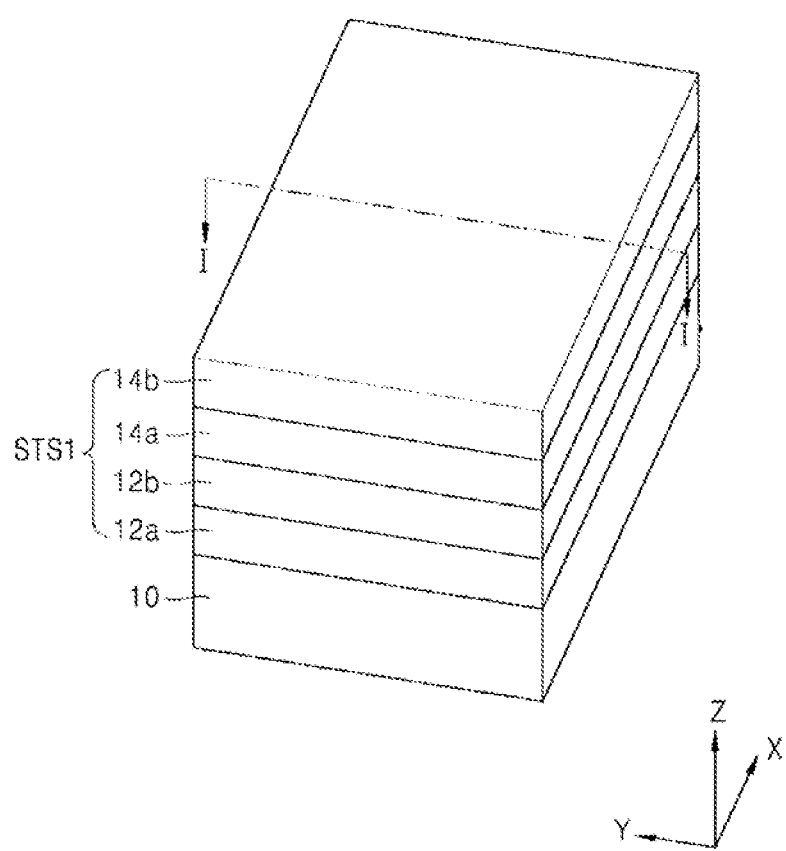
FIG. 1A is a perspective view illustrating a method of manufacturing a semiconductor device, according to an exemplary embodiment of the inventive concept.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

In the accompanying drawings, relative sizes, shapes, and thicknesses of the various structures may be exaggerated for clarity.

In the detailed description that follows, for convenience sake, enumerations such as "first" and "second" may be used for describing various elements, components and/or sections (or regions). However, the elements, the components and or the sections (or the regions) are not limited thereto. The above terms are used for distinguishing an element, a component, or sections from another element, another component, or other sections.

FIGS. 1A to 3C are views illustrating a method of manufacturing a semiconductor device, according to an exemplary embodiment of the inventive concept.

Figure 1B:
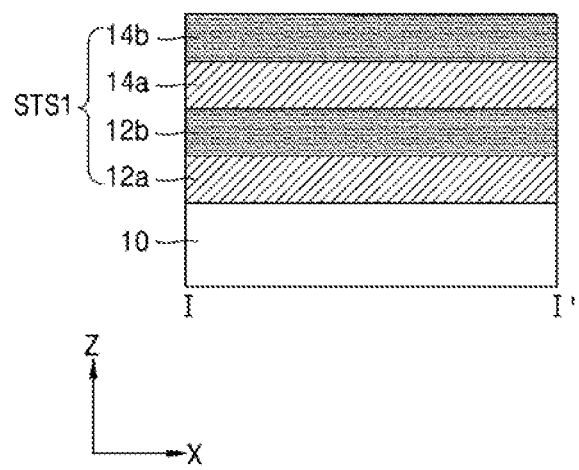
FIG. 1B is a cross-sectional view illustrating a method of manufacturing a semiconductor device, according to an exemplary embodiment of the inventive concept.
Figure 2A:
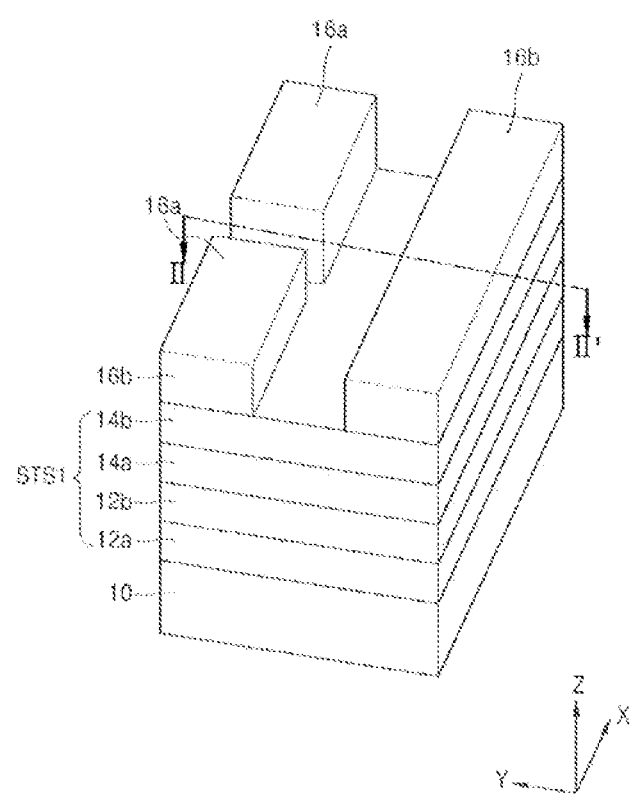
FIG. 2A is a perspective view illustrating a method of manufacturing a semiconductor device, according to an exemplary embodiment of the inventive concept.
Figure 2B:
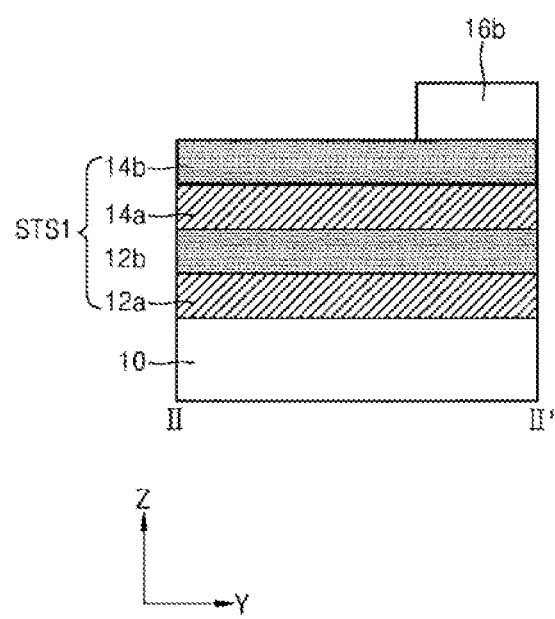
FIG. 2B is a cross-sectional view illustrating a method of manufacturing a semiconductor device, according to an exemplary embodiment of the inventive concept.
Figure 3A:
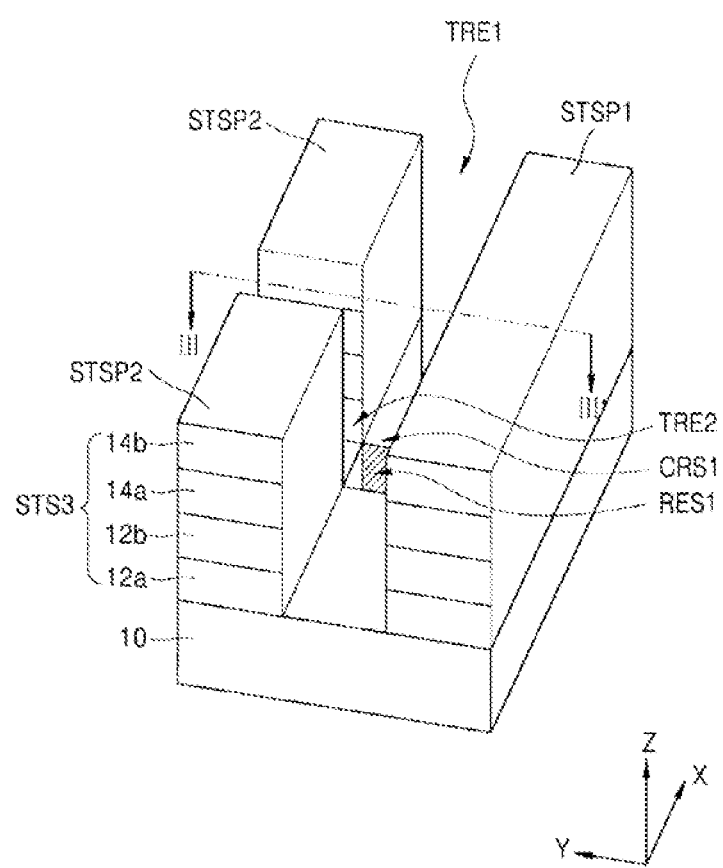
FIG. 3A is a perspective view illustrating a method of manufacturing a semiconductor device, according to an exemplary embodiment of the inventive concept.
Figure 3B:
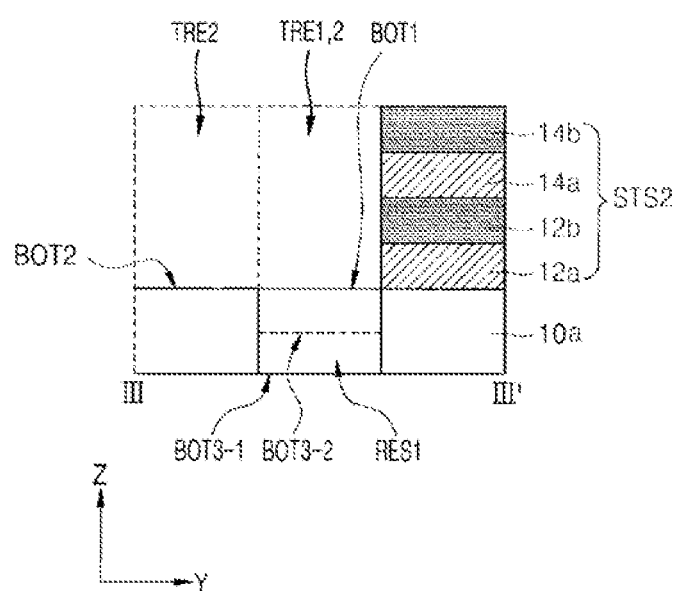
FIG. 3B is a cross-sectional view illustrating a method of manufacturing a semiconductor device, according to an exemplary embodiment of the inventive concept.
Figure 3C:
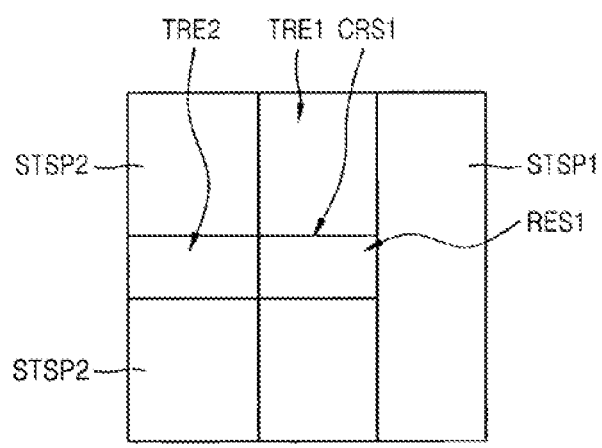
FIG. 3C is a plan view illustrating a method of manufacturing a semiconductor device, according to an exemplary embodiment of the inventive concept.

FIGS. 1A, 2A, and 3A are perspective views illustrating a method of manufacturing a semiconductor device. FIGS. 1B, 2B, and 3B are cross-sectional views taken along lines I-I' II-II', and III-III'. FIG. 3C is an upper plan view of FIG. 3A.

In FIGS. 1 to 3B, a direction perpendicular to an upper surface of a base layer 10 may be defined as a Z direction (a third direction) and two directions that run parallel with the upper surface of the base layer 10 and cross each other may be defined as an X direction (a first direction) and a Y direction (a second direction). The X direction and the Y direction may cross perpendicularly.

Referring to FIGS. 1A and 1B, a method of manufacturing a semiconductor device includes forming the base layer 10 on a substrate. The base layer 10 may be a polysilicon layer. A structure layer STS1 is formed on the base layer 10. The structure layer STS1 may be provided by forming at least one material layer, for example, first material layers 12a and 14a and second material layers 12b and 14b. The structure layer STS1 may be provided by disposing at least one material layer, for example, first material layers 12a and 14a and second material layers 12b and 14b in the Z direction on an X-Y plane.

For example, the structure layer STS1 may be a stacked structure layer in which first material layers 12a and 14a and second materiel layers 12b and 14b having different etch rates with respect to the first material layers 12a and 14a are alternately stacked. The structure layer STS1 may be a stack structure layer in which an oxide layer and a nitride layer are alternately slacked. The structure layer STS1 may be an insulating structure layer. Forming the structure layer STS1 as an insulating structure layer will be described below.

Referring to FIGS. 2A and 2B, mask patterns 16a and 16b are formed on the uppermost material layer of the structure layer STS1, e.g., the second material layer 14b. The mask patterns 16a and 16b may be hard mask patterns or photoresist patterns. The mask patterns 16a and 16b may be formed by using a photolithography process.

The mask pattern 16a may extend ii the X direction. The mask pattern 16b may include a plurality of patterns spaced apart from each other in the X direction. The mask pattern 16a and the mask pattern 16b may be spaced apart from each other in the Y direction.

Referring to FIGS. 3A to 3C, structure patterns STSP1 and STSP2 and a base pattern 10a are formed by etching the structure layer STS1 by using the mask patterns 16a and 16b (refer to FIGS. 2A and 2B). The structure patterns STSP1 and STSP2 and the base pattern 10a may be formed by patterning the structure layer STS1 and the base layer 10 (refer to FIGS. 2A and 2B).

The structure patterns STSP1 and STSP2 may include a first trench TRE1 that extends in the X direction on the base layer 10 (refer to FIGS. 2A and 2B) and a second trench TRE2 having a cross portion CRS1 connected to the first trench TRE1 in the Y direction perpendicular to the X direction.

The base pattern 10a may have a recess portion RES1 recessed downward from a surface of the base layer 10 (refer to FIGS. 2A and 2B) at the cross portion CRS1. When the recess portion RES1 is formed, in the case in which the base layer 10 (refer to FIGS. 2A and 2B) is further etched, the recess portion RES1 may be a penetration portion that at least partially penetrates the base layer 10 (refer to FIGS. 2A and 2B).

The structure patterns STSP1 and STSP2 may include the first structure pattern STSP1 that extends in the X direction and the plurality of second structure patterns STSP2 that are spaced apart from the second trench TRE2 in the X direction.

The first trench TRE1, the second trench TRE2, and the recess portion RES1 may be formed by an etching process. A bottom surface BOT1 of the first trench TRE1 is formed in the same position as a bottom surface BOT2 of the second trench TRE2, and a bottom surface BOT3-2 of the recess portion RES1 is formed in a position lower than the bottom surfaces BOT1 and BOT2 of the first trench TRE1 and the second trench TRE2. The recess portion RES may be a penetration portion that at least partially penetrates the base layer 10 (refer to FIGS. 2A and 2B).

In the above-described method of manufacturing a semiconductor device, the structure patterns STSP1 and STSP2 having the first trench TRE1 and the second trench TRE2 in a direction different from the first trench TRE1 may be formed by an etching process and the base pattern 10a having the recess portion RES1 at the cross portion CTS1 of the first trench TRE1 and the second trench TRE2 may be simultaneously formed.

FIG. 4A to 7B are views illustrating a method of manufacturing a semiconductor device, according to an exemplary embodiment of the inventive concept.

For example, the method of manufacturing a semiconductor device of FIGS. 4A to 7B is substantially similar to the method of manufacturing a semiconductor device of FIGS. 1 to 3B except for shapes and/or configurations of structure patterns STSP3 and STSP4 and except that a lower wiring structure 33 and an upper wiring structure 42 are further formed.

FIGS. 4A, 5A, 6A, and 7A are perspective views illustrating a method of manufacturing a semiconductor device. FIGS. 4B, 5B, 6B, and 7B are cross-sectional views taken along lines IV-IV', V-V', VI-VI', and VII-VII' of FIGS. 4A, 5A, 6A, and 7A. FIG. 6C is a plan view illustrating an upper portion of FIG. 6.

In FIGS. 4A to 7B, a direction perpendicular to an upper surface of the lower wiring structure 33 may be defined as a Z direction (a third direction) and two directions that run parallel with the upper surface of the lower wiring structure 33 and cross each other may be defined as the X direction (the first direction) and the Y direction (the second direction). The X direction and the Y direction may cross perpendicularly.

Figure 4A:
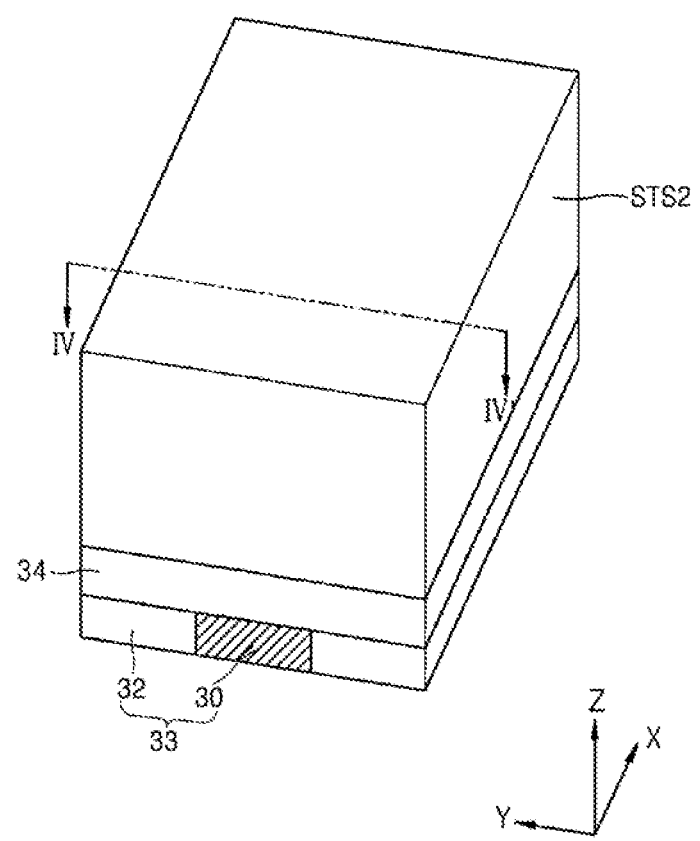
FIG. 4A is a perspective view illustrating a method of manufacturing a semiconductor device, according to an exemplary embodiment of the inventive concept.
Figure 4B:
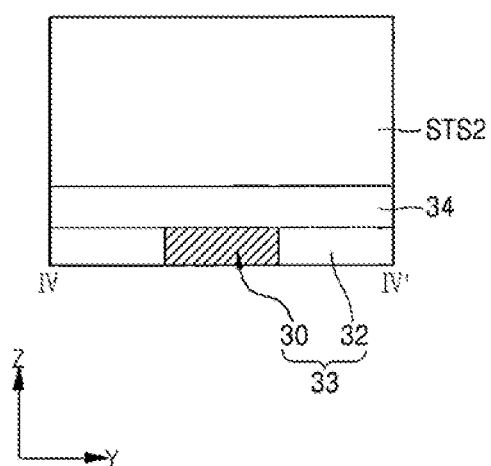
FIG. 4B is a cross-sectional view illustrating a method of manufacturing a semiconductor device, according to an exemplary embodiment of the inventive concept.

Referring to FIGS. 4A and 4B, a method of manufacturing a semiconductor device includes forming the lower wiring structure 33 on a substrate. The lower wiring structure 33 may include a lower wiring layer 30 and a lower insulating layer 32. The lower wiring layer 30 may extend in the X direction.

A base layer 34 is formed on the lower wiring structure 33. The base layer 34 may be a polysilicon layer. A structure layer STS2 is formed on the base layer 34. The structure layer STS2 may be an insulating structure layer including at least one insulating layer. The structure layer STS2 may be provided by forming at least one insulating layer in the Z direction on the X-Y plane.

Figure 5A:
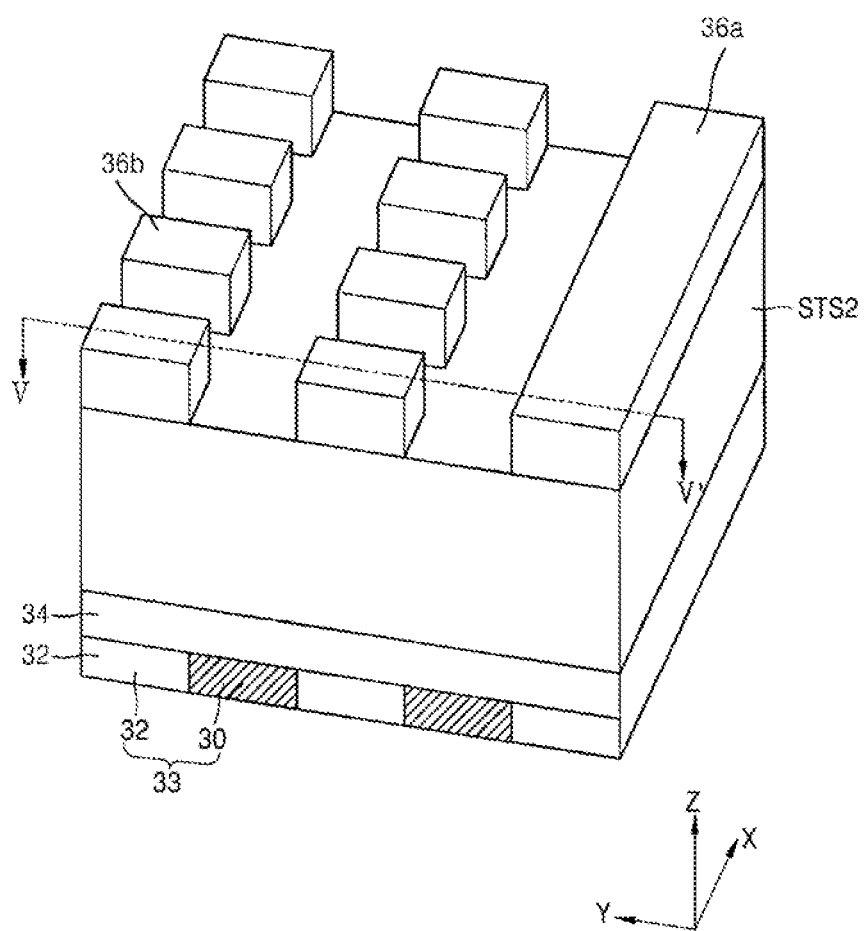
FIG. 5A is a perspective view illustrating a method of manufacturing a semiconductor device, according to an exemplary embodiment of the inventive concept.
Figure 5B:
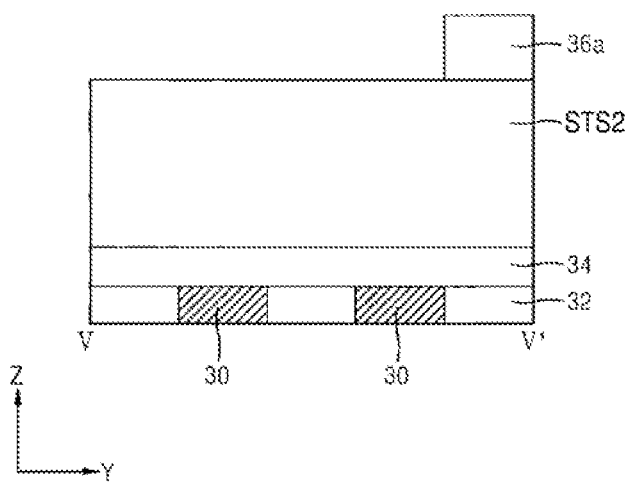
FIG. 5B is a cross-sectional view illustrating a method of manufacturing a semiconductor device, according to an exemplary embodiment of the inventive concept.

Referring to FIGS. 5A and 5B, mask patterns 36a and 36b are formed on the structure layer STS2. The mask patterns 36a and 36b may be hard mask patterns or photoresist patterns. The mask patterns 36a and 36b may be formed by using the photolithography process.

The mask pattern 36a may extend in the X direction. The mask patterns 36b may be a plurality of patterns spaced apart from each other in the X direction. The mask pattern 36a and the mask patterns 36b may be spaced apart from each other in the Y direction.

Figure 6A:
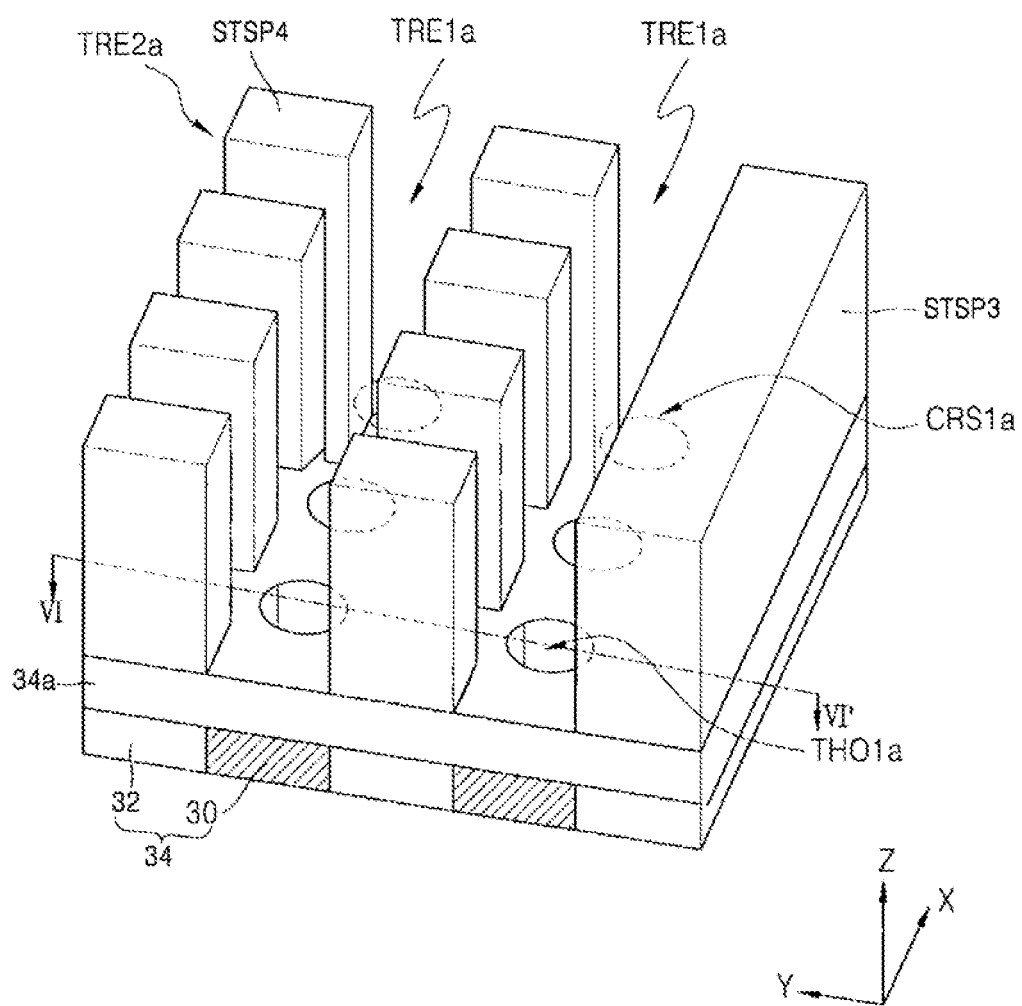
FIG. 6A is a perspective view illustrating a method of manufacturing a semiconductor device, according to an exemplary embodiment of the inventive concept.
Figure 6B:
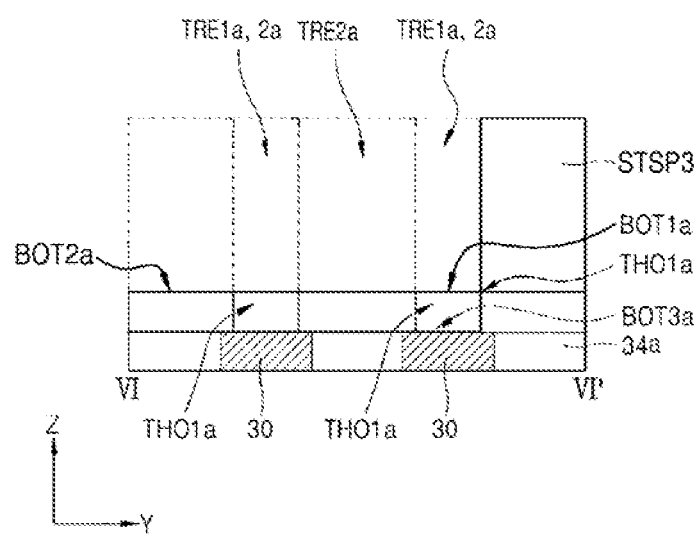
FIG. 6B is a cross-sectional view illustrating a method of manufacturing a semiconductor device, according to an exemplary embodiment of the inventive concept.
Figure 6C:
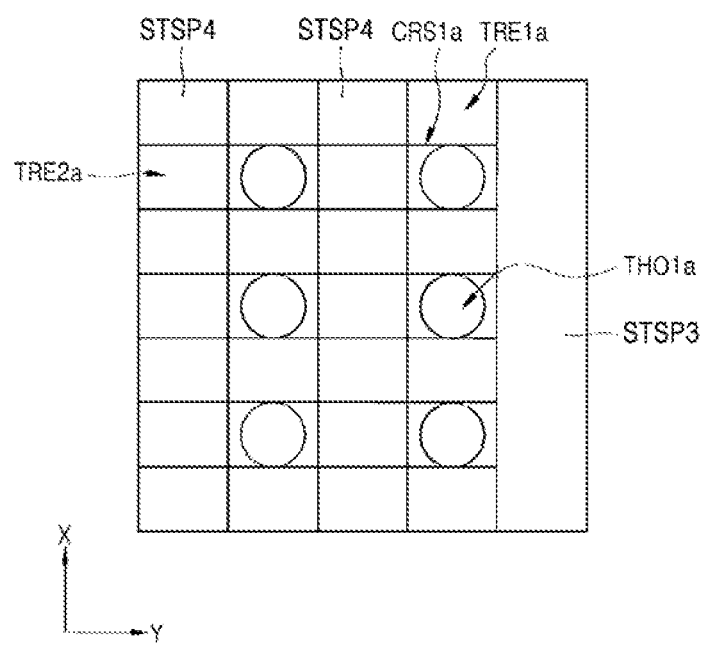
FIG. 6C is a plan view illustrating a method of manufacturing a semiconductor device, according to an exemplary embodiment of the inventive concept.

Referring to FIGS. 6A to 6C, the structure patterns STSP3 and STSP4 and the base pattern 34a are formed by etching the structure layer STS2 by using the mask patterns 36a and 36b (refer to FIGS. 5A and 5B). The structure patterns STSP3 and STSP4 and the base pattern 34a may be formed by patterning the structure layer STS2 and the base layer 34 (refer to FIGS. 5A and 5B).

By the above process, the structure parents STSP3 and STSP4 may have a first trench TRE1a that extends in the X direction on the base layer 34 (refer to FIGS. 5A and 5B) and a second trench TRE2a having a cross portion CRS1a connected to the first trench TRE1a in the Y direction perpendicular to the X direction. The base patient 34a may have penetration portions THO1a that at least partially penetrate the base layer 34 (refer to FIGS. 5A and 5B) in the cross portion CRS1a.

The structure patterns STSP3 and STSP4 may include a plurality of second trenches TRE2a. The plurality of second trenches TRC2a include a plurality of cross portions CRS1a connected to the first trench TRE1a in the X direction, and a plurality of penetration portions THO1a may be formed at the plurality of cross portions CRS1a.

The structure patterns STSP3 and STSP4 may include a first structure pattern STSP3 that extends in the X direction and a plurality of second structure patterns STSP4 separated from each other by the second trench TRE2a in the X direction. The second structure patterns STSP4 may be separated from each other by the first trench TRE1a and the second trench TRE2a in the X and Y directions. The first trench TRE1a, the second trench TRE2a, and the penetration portions THO1a may be formed by an etching process.

For example, the structure patterns STSP3 and STSP4 having the first trench TRE1a and the second trench TRE2a in a direction different from the first trench TRE1a may be formed by an etching process, and the base pattern 34a having the penetration portions THO1a may be simultaneously formed at the cross portion CTS1a of the first trench TRE1a and the second trench TRE2a.

A bottom surface BOT1a of the first trench TRE1a is formed in the same position as a bottom surface BOT2a of the second trench TRE2a, and a bottom surface BOT3a of the penetration portions THO1a may be formed to be lower than the bottom surfaces BOT1a and BOT2a of the first trench TRE1a and the second trench TRE2a.

Figure 7A:
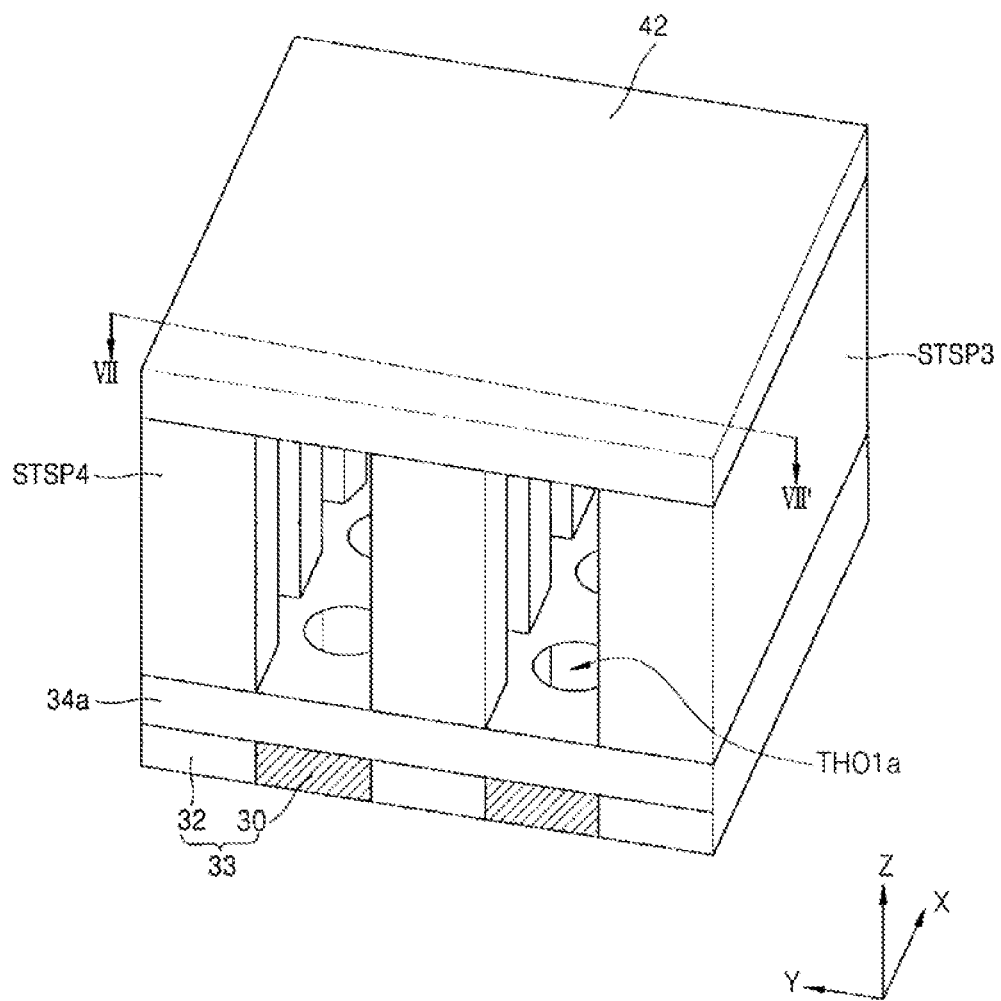
FIG. 7A is a perspective view illustrating a method of manufacturing a semiconductor device, according to an exemplary embodiment of the inventive concept.
Figure 7B:
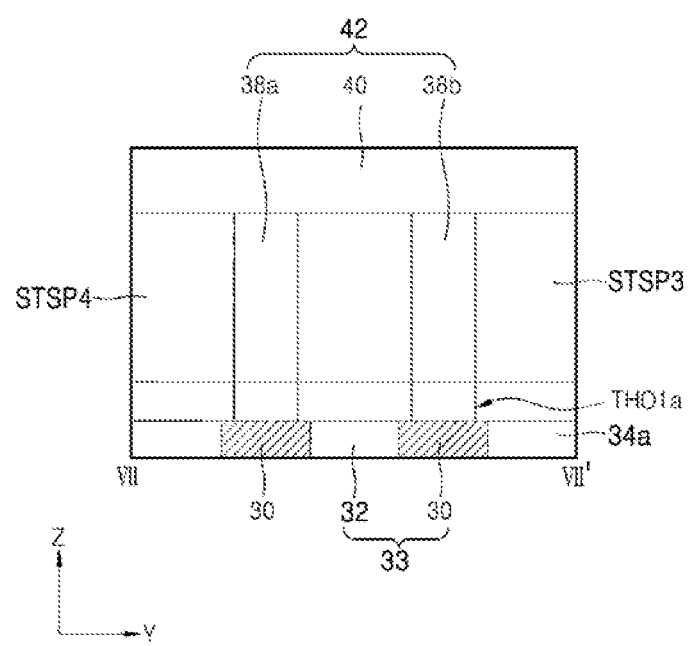
FIG. 7B is a cross-sectional view illustrating a method of manufacturing a semiconductor device, according to an exemplary embodiment of the inventive concept.

Referring to FIGS. 7A and 7B, an upper wiring structure 42 is formed on the structure patterns STSP3 and STSP4 having the first trench TRE1a and the second trench TRE2a in a direction different from the first trench TRE1a and the base pattern 34a having the penetration portions THO1a. The upper wiring structure 42 may include contact plugs 38a and 38b connected to a lower wiring layer 30 through the penetration portions THO1a and an upper wiring layer 40 covering the first trench TRE1a, connected to the contact plugs 38a and 38b, and extending in the X or Y direction. In FIG. 7A, the contact plugs 38a and 38b are omitted merely for convenience of illustration.

The upper wiring structure 42 may include the plurality of contact plugs 38a and 38b and the plurality of contact plugs 38a and 38b may be electrically connected to the upper wiring layer 40 that extends in the first or second direction. The contact plugs 38a and 38b connected to the lower wiring layer 30 and the upper wiring layer 40 that extends in the X or Y direction may be formed in the current process.

Hereinafter, an example is described in which the method of manufacturing a semiconductor device of FIGS. 1A to 3C and 4A to 7B is applied to a method of manufacturing a vertical type semiconductor memory device.

Figure 8:
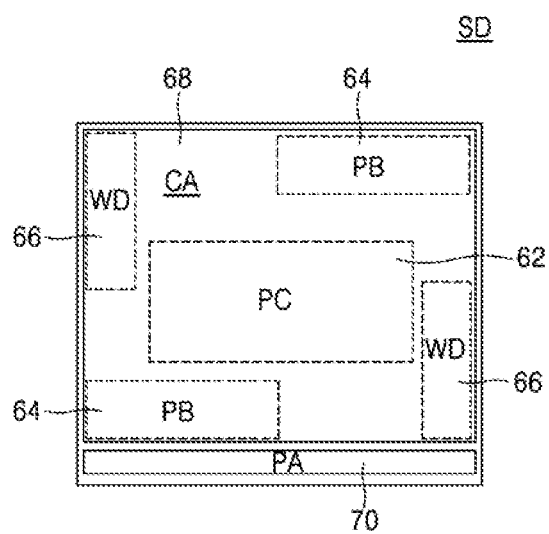
FIG. 8 is a layout diagram illustrating a vertical type semiconductor memory device manufactured according to an exemplary embodiment of the inventive concept.

FIG. 8 is a layout diagram of a vertical type semiconductor memory device SD that may be manufactured according to exemplary embodiments of the inventive concept.

The vertical type semiconductor memory device SD may be a non-volatile memory device. The vertical type semiconductor memory device SD may have a cell over peri (COP) structure in which a memory cell array 68 is stacked on peripheral circuits 62, 64, and 66. The memory cell array 68 and CA may include a vertical type memory cell including a channel that extends in a direction perpendicular to an upper surface of a substrate. In the vertical type semiconductor memory device SD, a pad 70 and PA may be arranged at one side of the memory cell array 68 and CA.

The peripheral circuits 62, 64, and 66 may include a first peripheral circuit 62 and PC, a second peripheral circuit 64 and PB, and a third peripheral circuit 66 and WD. The first peripheral circuit 62 and PC may include a latch circuit, a cache circuit, a column decoder, a sense amplifier, or a data in/out circuit. The second peripheral circuit 64 and PB may be a page buffer. The third peripheral circuit 66 and WD may be a word line driver.

Figure 9:
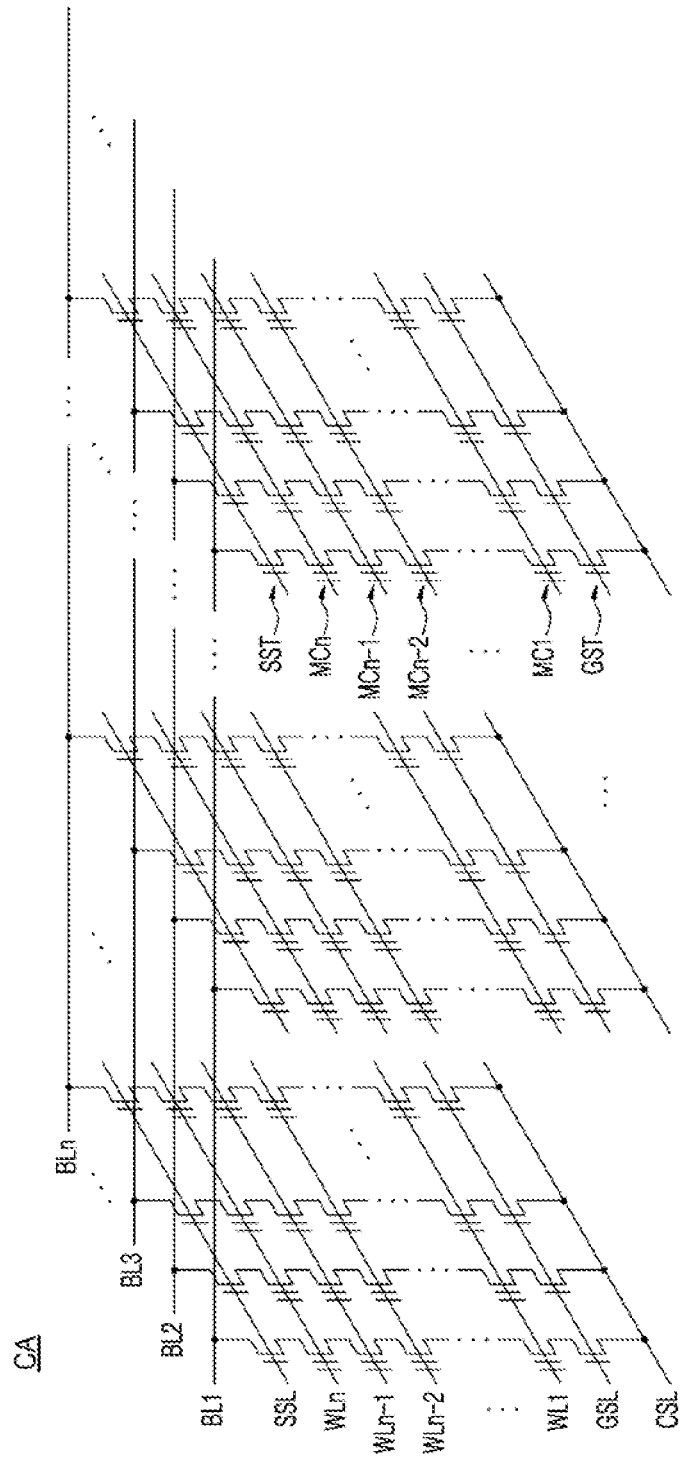
FIG. 9 is an equivalent circuit diagram illustrating a memory cell array of a vertical type semiconductor memory device manufactured according to an exemplary embodiment of the inventive concept.

FIG. 9 is an equivalent circuit diagram illustrating a memory cell array of a vertical type semiconductor memory device that may be manufactured according to exemplary embodiments of the inventive concept.

FIG. 9 is a memory cell array CA of FIG. 8. The memory cell array CA may include "n" serially connected memory cell devices MC1 to MCn and a plurality of memory cell strings including a ground selection transistor GST and a string selection transistor SST that are serially connected at both ends of the memory cell devices MC1 to MCn.

The n serially connected memory cell devices MC1 to MCn may be respectively connected to word lines WL1 to WLn for selecting at least some of the memory cell devices MC1 to MCn. A gate terminal of the ground selection transistor GST is connected to a ground selection line GSL and a source terminal thereof may be connected to a common source line CSL.

A gate terminal of the string selection transistor SST is connected to a suing selection line SSL and a source terminal thereof may be connected to a drain terminal of the memory cell device MCn. In the drawing, it is illustrated that the ground selection transistor GST and the suing selection transistor SST are connected to the n serially connected memory cell devices MC1 to MCn. However, a plurality of ground selection transistors GST or a plurality of string selection transistors SST may be connected to the serially connected n memory cell devices MC1 to MCn.

A drain terminal of the string selection transistor SST may be connected to bit lines BL1 to BLm. When a signal is applied to the gate terminal of the string selection transistor SST through the string selection line SSL, the signal applied through the bit lines BL1 to BLm are transmitted to the n serially connected memory cell devices MC1 to MCn so that a data read or write operation may be performed. In addition, a signal is applied to a gate terminal of the gate selection transistor GST of which a source terminal is connected to CSL through a gate selection line GSL so that an erase operation of removing all charges stored in the n memory cell devices MC1 to MCn may be performed.

Figure 10:
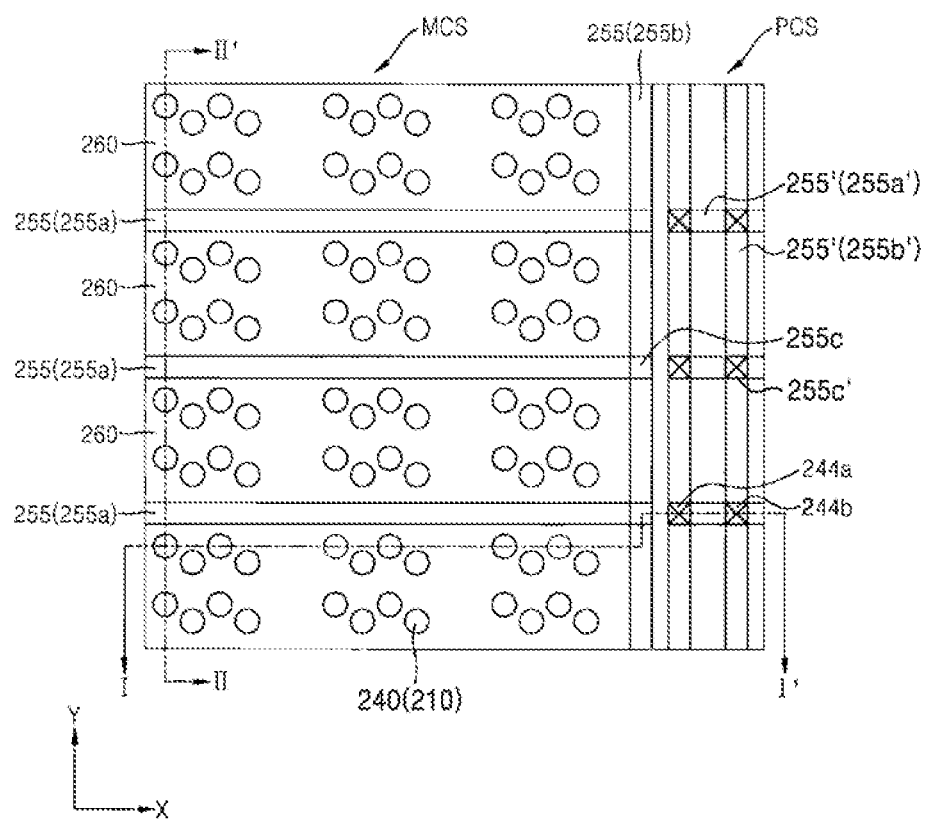
FIG. 10 is a plan view illustrating a vertical type semiconductor memory device manufactured according to an exemplary embodiment of the inventive concept.
Figure 11A:
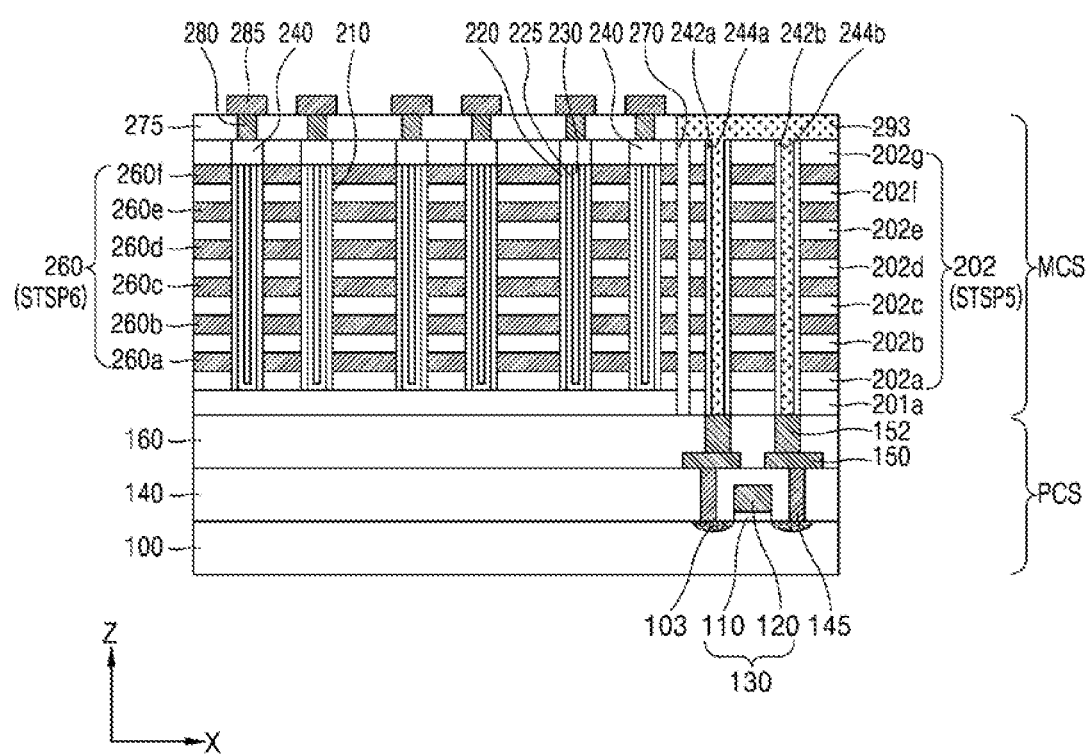
FIGS. 11A and 11C are cross-sectional views taken along the line I-I' of FIG. 10.
Figure 11B:
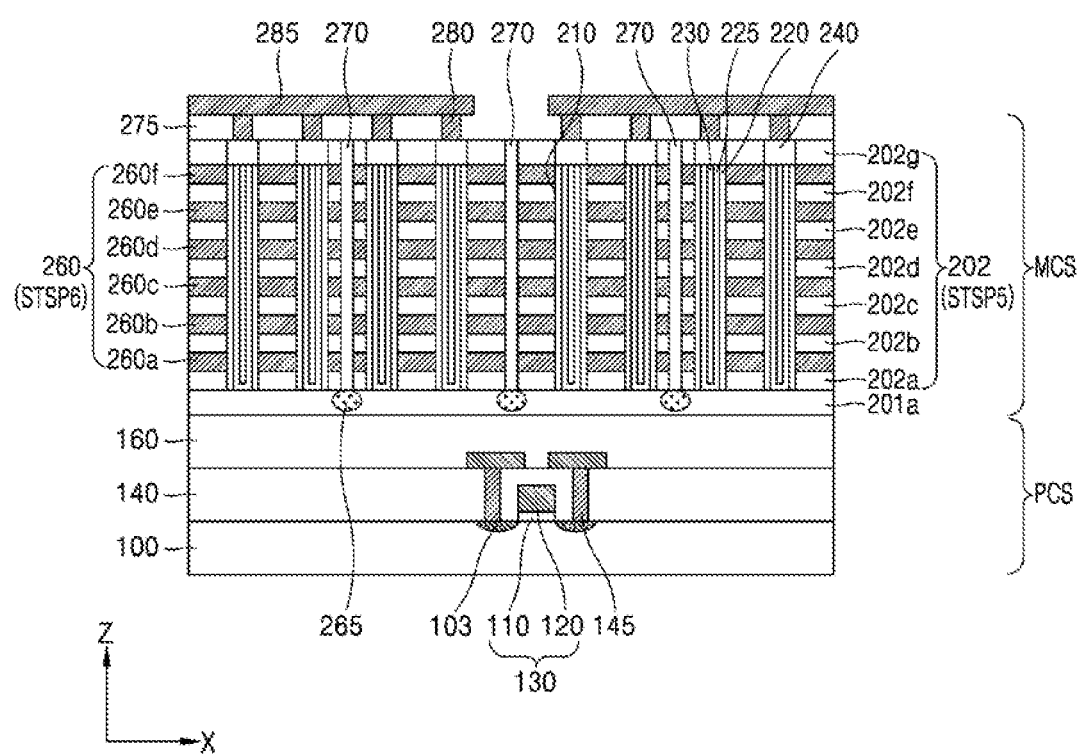
FIG. 11B is a cross-sectional view taken along the line II-II' of FIG. 10.
Figure 11C:
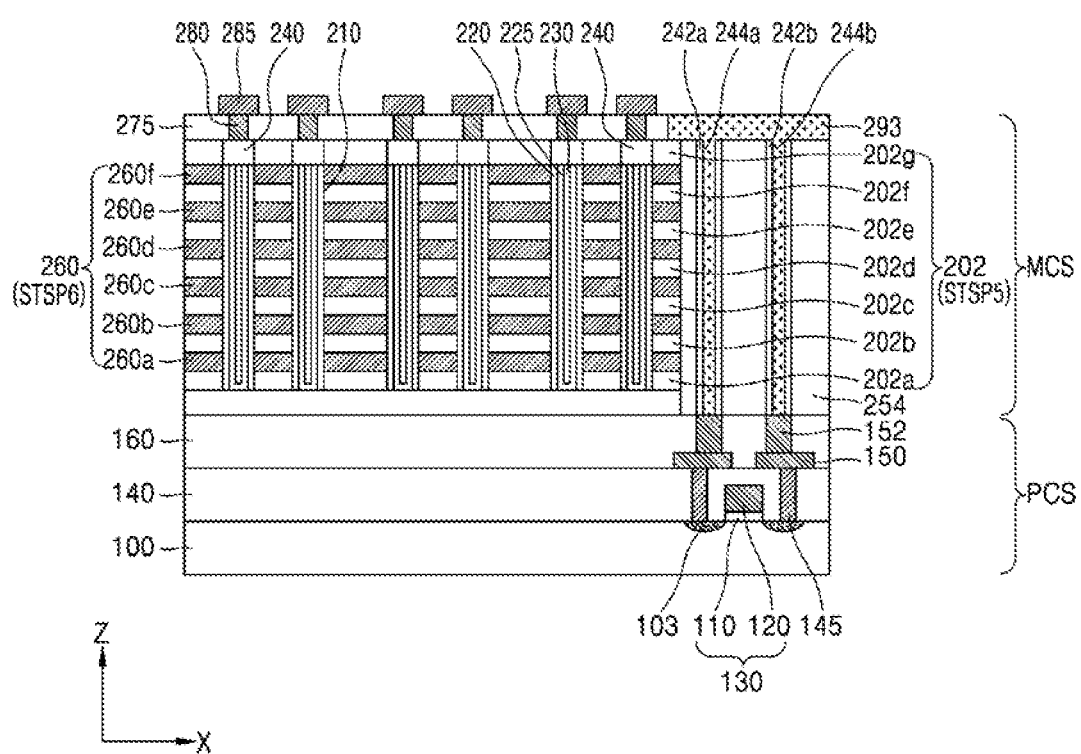

FIG. 10 is a plan view illustrating a vertical type semiconductor memory device that may be manufactured according to exemplary embodiments of the inventive concept. FIGS. 11A and 11C are cross-sectional views taken along the line I-I' of FIG. 10. FIG. 11B is a cross-sectional view taken along the line II-II' of FIG. 10.

FIGS. 10 and 11A to 11C may be the vertical type semiconductor memory device SD of FIG. 8. In FIGS. 10 and 11A to 11C, a direction perpendicular to an upper surface of a substrate 100 is defined as the Z direction (the third direction), two directions that run parallel with the upper surface of the substrate 100 and cross each other may be defined as the X direction (the first direction) and the Y direction (the second direction). The X direction and the Y direction may cross to be perpendicular to each other. The X direction may be a word line direction of FIG. 9 and the Y direction may be a bit line direction.

In FIG. 10, for convenience sake, not all of the elements of the vertical type semiconductor memory device SD are illustrated, and some elements are omitted. The vertical type semiconductor memory device SD may include a peripheral circuit structure (PCS) and a memory cell structure (MCS).

In FIG. 10, channel holes 210, pads 240, word lines (or gate lines) 260, trenches 255 and 255', upper contact plugs 244a and 244b, and an upper wiring layer 203 are illustrated. The trench 255 of the memory cell structure MCS may include a first trench 255a that extends in the X direction and a second trench 255b that extends in the Y direction and has a cross portion 255c that crosses the first trench 255a. The first trench 255a and the second trench 255b of the memory cell structure MCS may be a word line cut region (or a gate line cut region).

The trench 255' of the PCS may include a first peripheral trench 255a' that extends in the X direction and a second peripheral trench 255b' that extends in the Y direction and has a cross portion 255c' that crosses the first peripheral trench 255a'.

The first trench 255a and the first peripheral trench 255a' may correspond to the first trenches TRE1 and TRE1a previously described in FIGS. 3A to 3C and 6A to 6C and so it may be assumed that to the extent that details are net provided herein, the omitted details may be at least similar to those previously described for the corresponding elements. The second trench 255b and the second peripheral trench 255b' may correspond to the second trenches TRE2 and TRE2a' previously described in FIGS. 3A to 3C and 6A to 6C and so it may be assumed that to the extent that details are not provided herein, the omitted details may be at least similar to those previously described for the corresponding elements.

The cross portion 255c may correspond to the cross portions CRS1 and CRS1a described in FIGS. 3A to 3C and 6A to 6C. The upper contact plugs 244a and 244b may correspond to contact plugs 38a and 38b described in FIG. 7. The upper wiring layer 293 may correspond to the upper wiring layer 40 described in FIG. 7.

In FIGS. 11A to 11C, the vertical type semiconductor memory device SD may include the PCS formed on the substrate 100 and the MCS stacked on the PCS.

The PCS may include a transistor including a gate structure 130 and a source/drain region 103 formed on the substrate 100, first and second lower insulating layers 140 and 160, first and second lower contact plugs 145 and 151, and a lower wiring layer 150. A semiconductor substrate including single crystal silicon or single crystal germanium may be used as the substrate 100. In FIGS. 11A to 11C, for convenience sake, only one transistor is illustrated. However, a plurality of transistors may be formed.

The gate structure 130 may include a gate insulating layer pattern 110 and a gate electrode 120 that are sequentially stacked on the substrate 100. The gate insulating layer pattern 110 may include a silicon oxide or a metal oxide. The gate electrode 120 may include a metal, a metal nitride, or doped polysilicon. The source/drain region 103 may include n-type or p-type impurities.

The first lower insulating layer 140 that covers the transistor is formed on the substrate 100. The first lower contact plug 145 may be connected to the source/drain region 103 through the first lower insulating layer 140. The lower wiring layer 150 is arranged on the first lower insulating layer 140 and may be electrically connected to the first lower contact plug 145. The second lower insulating layer 160 that covers the lower wiring layer 150 may be formed on the first lower insulating layer 140.

The second lower contact plug 152 connected to the lower wiring layer 150 may be formed in the second lower insulating layer 160. The first and second lower insulating layers 140 and 160 may include an insulating material such as a silicon oxide. The first and second lower contact plugs 145 and 152 and the lower wiring layer 150 may include a metal, a metal nitride, or doped polysilicon. The first and second lower insulating layers 140 and 160. the first and second lower contact plugs 145 and 152, and the lower wiring lam 150 may correspond to the previously described lower wiring structure 33 (refer to FIGS. 4A and 4B) and so it may be assumed that to the extent that details are not provided herein, the omitted details may be at least similar to those previously described for the corresponding elements.

The MCS may include structure patterns STSP5 and STSP6 including interlayer insulating layers 202a to 202g and gate lines 260a to 260f. The MCS may include a base pattern 201a formed on the second lower insulating layer 160, channels 225, the pads 240, gate lines 260. bit line contact plugs 280, bit lines 285, the upper contact plugs 244a and 244b, and the upper wiring layer 293. The base pattern 201a may include polysilicon or single crystal silicon.

The channels 225 are arranged on the base pattern 201a and may extend from an upper surface of the base pattern 201a in the Z direction. The channels 225 may be unfilled cylinder or cup-shaped. The channels 225 may include polysilicon or single crystal silicon and an impurity region including p-type impurities such as boron (B).

The plurality of channels 225 are arranged in the X direction and may form a channel row. The channel rows may face the adjacent channels 225 in zigzag configuration. Therefore, a larger number of channels 225 may be accommodated in the base pattern 201a per unit area, as compared with alternate configurations.

A pillar-shaped or cylinder-shaped buried layer pattern 230 may be formed in an internal space of the channel 225. The buried layer pattern 230 may include an insulating material such as a silicon oxide. The channel 225 may be pillar-shaped or shaped as a solid cylinder. In this case, the buried layer pattern 230 may be omitted. A dielectric layer structure 220 may be formed on an external wall of the channel 225.

The dielectric layer structure 220 maybe substantially cup-shaped with the center of a bottom surface being opened or straw-shaped. The dielectric layer structure 220 may include a tunnel insulating layer, a charge storage layer, and a blocking layer that are sequentially stacked on the external wall of the channel 225.

The blocking layer may include a metal oxide such as a silicon oxide, a hafnium oxide, or an aluminium oxide. The charge storage layer may include a nitride such as a silicon nitride or a metal oxide. The tunnel insulating layer may include an oxide such as a silicon oxide. Each of the blocking layer, the charge storage layer, and the tunnel insulating layer may have an oxide-nitride-oxide (ONO) structure in which at oxide layer-a nitride layer-an oxide layer are sequentially stacked.

The pad 240 may be formed on a channel structure including the dielectric layer structure 220, the channel 225, and the buried layer pattern 230. For example, the pad 240 may cap the dielectric layer structure 220, the channel 225. and the buried layer pattern 230. The pad 240 may include a polysilicon or single crystal silicon and may further include n-type impurities such as phosphorus (P) and arsenic (As).

The pads 240 are formed in the X direction to correspond to the channel row and may form a pad row. The pads 240 may be arranged in a plurality of pad rows in the Y direction. The gate lines 260 are formed on an external wall of the dielectric layer structure 220 and may be stacked and spaced apart from each other in the Z direction. Each of the gate lines 260 may extend in the X direction while partially surrounding the channels 225 included in the channel rows.

The gate lines 260 may include the plurality of gate lines 260a to 260f. The gate lines 260a to 260f may be insulated by the plurality of interlayer insulating layers 202a to 202g. One gate line 260 may extend in the X direction while surrounding six channel rows in the Z direction. However, the number of channel rows included in the one gate line 260 is not limited to six and there may be fewer or more channel rows than six. The gate line 260 may include a metal or a metal nitride. For example, the gate line 260 may include a metal or a metal nitride with low electric resistance such as tungsten (W), a tungsten nitride, titanium (Ti), a titanium nitride, tantalum (Ta), a tantalum nitride, and/or platinum (Pt). The gate line 260 may have a multilayer structure in which a barrier layer including a metal nitride and a metal layer including a metal are stacked.

The lowermost gate line 260a may be provided as a ground selection line (GSL) and the uppermost gate line 260f may be provided as a string selection line (SSL). The gate lines 260b, 260c, 260d, and 260e arranged between the GSL and the SSL may be provided as word lines. In this case, the GSL, the word lines, and the SSL are respectively arranged over a layer, four layers, and a layer. However, the inventive concept is not limited thereto. For example, each of the GSL and the SSL may have a single-layer structure of a two-layer structure. The word lines may have a 2n layer structure where n is equal to four, eight, or 16.

The number of stacked gate lines 260 may be determined according to a circuit design and/or a degree of integration of the vertical type semiconductor memory device SD. The interlayer insulating layer 202 may be provided between the gate lines 260 adjacent in the Z direction. The interlayer insulating layer 202 may include a silicon oxide such as a silicon oxide ($SiO_2$), a silicon carbonate (SiOC), or a silicon oxyfluoride (SiOF).

The gate lines 260 may be isolated by the interlayer insulating layer 202 in the Z direction. The trenches 255 and 255' that penetrate the gate lines 260 and the interlayer insulating layers 202 in the Z direction may be formed between adjacent channel rows. The trenches 255 and 255' may be in the form of linear trenches that extend in the X and Y directions.

According to exemplary embodiments of the inventive concept, the gate lines 260 are cut by the trench 255 in a certain unit so that a gate line block may be defined. An upper surface of the base pattern 201a may be exposed by the trench 255 and the peripheral trench 255'. Separation patterns 270 may be provided in the trench 255. The separation patterns 270 may include an insulating material such as a silicon oxide.

Impurity regions 265 may lie formed in the upper portion of the base pattern 201a exposed by the trench 255. The impurity regions 265 is extend in the X direction and may be provided to a common source line (CSL). The impurity regions 265 may include n-type impurities such as P and As. A metal silicide pattern such as a cobalt silicide pattern or a nickel silicide pattern may be further formed on the impurity regions 265. According to an embodiment of the inventive concept, a CSL contact that contacts the impurity regions 265 through the separation patterns 270 may be formed.

The upper contact plugs 244a and 244b and the upper wiring layer 293 may be configured to apply a signal or a voltage from a peripheral circuit through the base pattern 201a. The upper contact plugs 244a and 244b may be electrically connected to the lower wiring layer 150 and the second lower contact plug 152 of the PCS. The upper contact plugs 244a and 244b may be electrically connected to the lower wiring layer 150 through the gate lines 260, the interlayer insulating layers 202, and the base pattern 201a. The upper contact plugs 244a and 244b may include a conductive material such as a metal or a metal nitride.

First and second insulating layer patterns 242a and 242b may be formed on external walls of the upper contact plugs 244a and 244b. The first and second insulating layer patterns 242a and 242b may include an insulating material such as a silicon oxide.

In FIG. 11C, the upper contact plugs 244a and 244b may be electrically connected to the lower wiring layer 150 through an insulating structure layer 254. For example, the upper contact plugs 244a and 244b may be electrically connected to the lower wiring layer 150 through the single insulating structure layer 254, rather than to the plurality of interlayer insulating layer s 202.

An upper insulating layer 275 may be formed on the uppermost interlayer insulating layer 202g, the pads 240, the separation patterns 270, and the upper contact plugs 244a and 244b. The bit line contact plugs 280 may contact the pads 240 through the upper insulating layer 275. The plurality of bit line contact plugs 280 are formed so that an array corresponding to an arrangement of the channels 225 or the pads 240 may be defined.

The bit lines 285 are arranged on the upper insulating layer 275 and may be electrically connected to the bit line contact plugs 280. For example, the bit lines 285 extend in the Y direction and may be electrically connected to the plurality of bit line contact plugs 280.

The upper wiring layer 293 may be formed on the upper contact plugs 244a and 244b. The upper wiring layer 293 may connect the first upper contact plug 244a and the second upper contact plug 244b. According to an embodiment of the inventive concept, the upper wiring layer 293 may be formed on the upper insulating layer 275. A signal or a voltage may be transmitted to transistors included in the PCS through the upper wiring layer 293.

Figure 16:
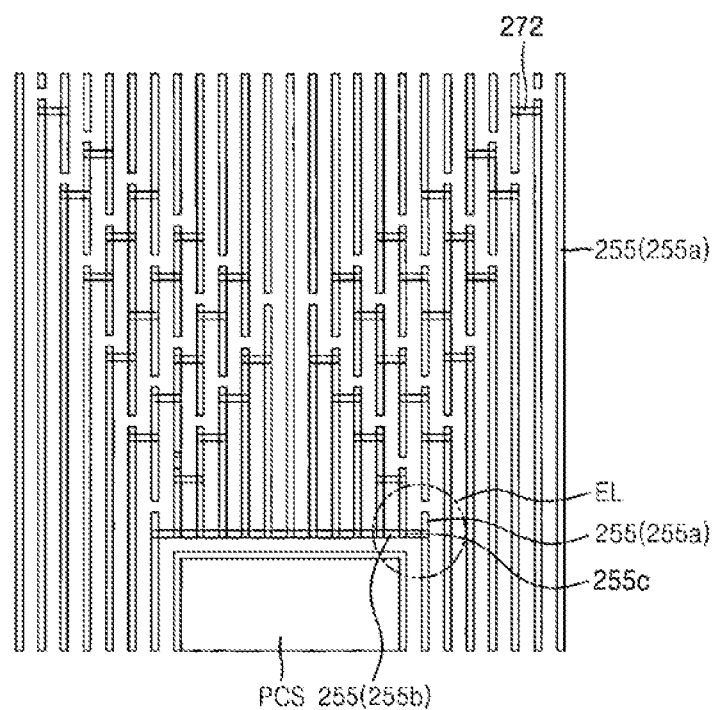
FIG. 16 is a layout diagram illustrating the trench and the peripheral trench of FIGS. 14A and 14B.
Figure 17:
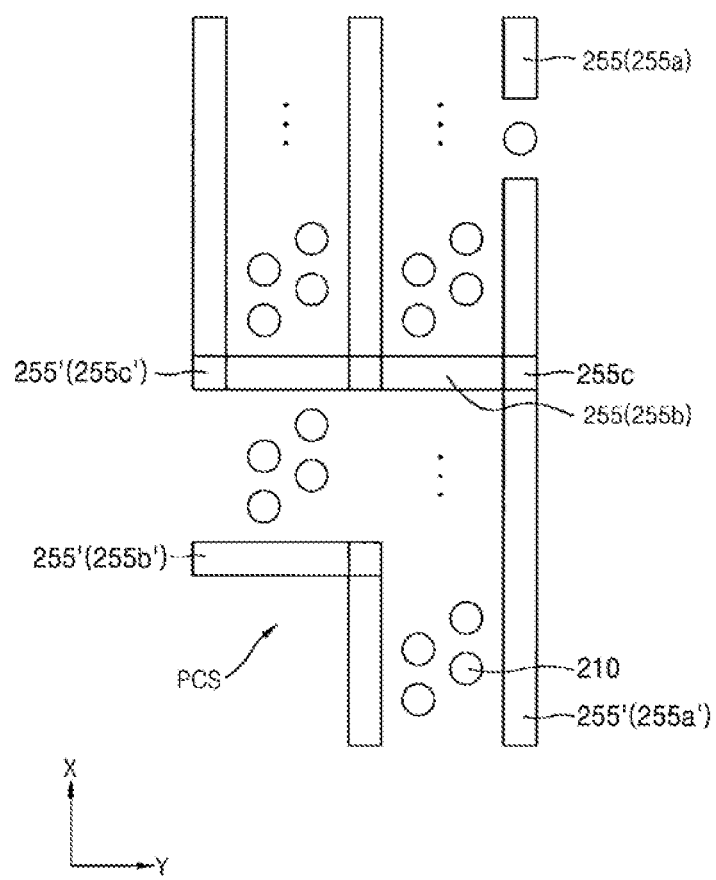
FIG. 17 is an enlarged view illustrating the portion EL of FIG. 16.

FIGS. 12 to 15B are cross-sectional views illustrating methods of manufacturing the semiconductor devices of FIGS. 10, 11A, and 11B. FIG. 16 is a layout diagram illustrating the trench and the peripheral trench of FIGS. 14A and 14B. FIG. 17 is an enlarged view illustrating the portion EL of FIG. 16.

FIGS. 12, 3, 14A, and 15A illustrate a method of manufacturing a semiconductor device taken along the line I-I' of FIG. 10. FIGS. 14B and 15B illustrate a method of manufacturing a semiconductor device taken along the line II-II of FIG. 10.

Figure 12:
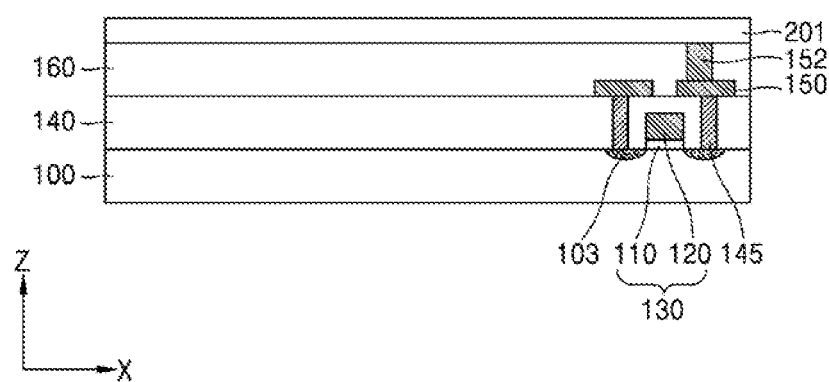
FIG. 12 to 15B are cross-sectional views illustrating methods of manufacturing the semiconductor devices of FIGS. 10, 11A, and 11B.

Referring to FIG. 12. gate structures 130 and source drain regions 103 may be formed on the substrate 100. A semiconductor substrate including a semiconductor material such as single crystal silicon or single crystal germanium may be used as the substrate 100. For example, the substrate 100 may be a silicon wafer. After forming a gate insulating layer and a gate electrode layer on the substrate 100, the gate insulating layer and the gate electrode layer are etched so that the gate insulating layer pattern 110 and the gate electrode 120 may be formed. The gate structure 130, including the gate insulating layer pattern 110 and the gate electrode 120 that are sequentially stacked on the substrate 100, may accordingly be formed.

The source/drain regions 103 may be formed on the substrate 100 adjacent to the gate structures 130 through an ion implantation process in which the gate structure 130 is used as an ion implantation mask. The gate insulating layer may be formed through a chemical vapour deposition (CVD) process, a plasma enhanced chemical vapour deposition (PECVD) process, a spin coating process, or an atomic layer deposition (ALD) process by using a silicon oxide or a metal oxide.

The gate insulating layer may alternatively be formed by performing a thermal oxidation process on an upper surface of the substrate 100. The gate electrode layer may be formed by the ALD process or a sputtering process by using a metal, a metal nitride, or doped polysilicon. Then, a first lower insulating layer 140 that covers the gate structures 130 may be formed on the substrate 100.

A first lower contact plug 145 that contacts the source/drain region 103 through the first lower insulating layer 140 may be formed. The first lower contact plug 145 that contacts the source/drain region 103 may be so-formed. The lower wiring layer 150 electrically connected to the first lower contact plug 145 may be formed on the first lower insulating layer 140. The second lower insulating layer 160 that covers the lower wiring layer 150 is formed on the first lower insulating layer 140.

The first and second lower insulating layers 140 and 160 may be formed through the CVD process or the spin coating process by using an insulating material such as a silicon oxide. The first lower contact plug 145 and the lower wiring layer 150 may be formed through the ALD process or the sputtering process by using a metal or a metal nitride.

The second lower contact plug 152 connected to the lower wiring layer 150 may be formed on the second lower insulating layer 160. The second lower contact plug 152 may be connected to the lower wiring layer 150 through the second lower insulating layer 160. In FIG. 12, only the lower wiring layer 150 is illustrated. However, an additional wiring layer may be further provided.

A base layer 201 may be formed on the second lower insulating layer 160 and the second lower contact plug 152. The base layer 201 may be formed through the sputtering process, the CCVD process, the ALD process, or the PVD process by using polysilicon.

The base layer 201 may be formed by using, for example, p-type impurity doped polysilicon. In this case, the base layer 201 may be provided as a p-type well. According to an embodiment of the inventive concept, the base layer 201 may be formed by forming an amorphous silicon layer on the second lower insulating layer 160 and the second lower contact plug 152 and then, changing the amorphous silicon layer into a single crystal silicon layer by thermal processing or laser beam irradiation. In this case, defects in the base layer 201 may be removed so that, for example, the base layer 201 may better perform as a p-type well.

Figure 13:
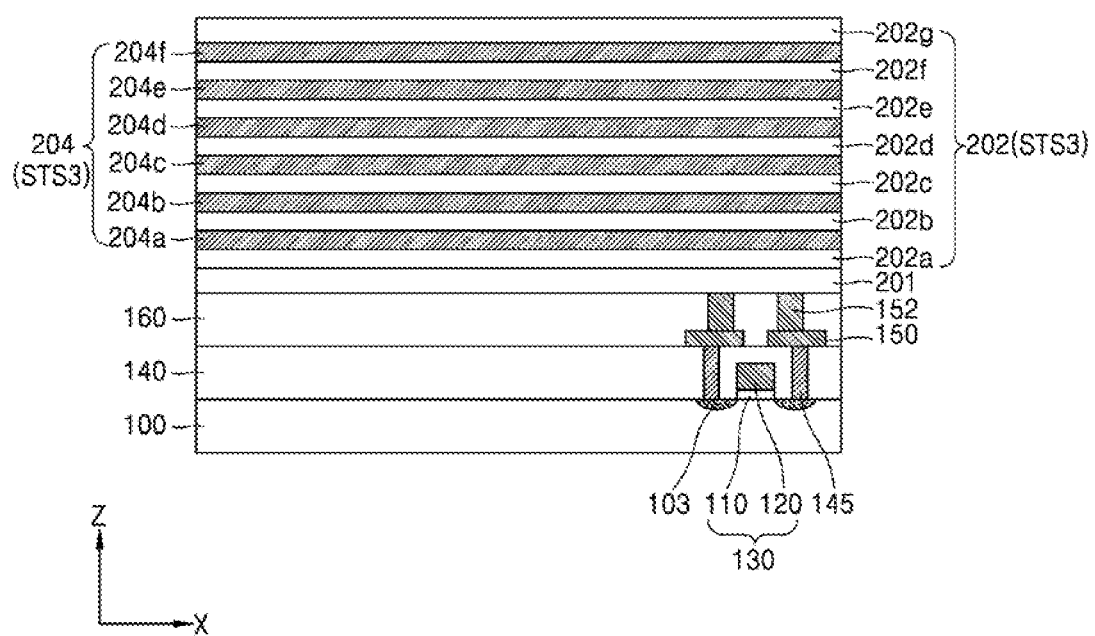

Referring to FIG. 13, a structure layer STS3 is formed by alternately and repeatedly stacking the interlayer insulating layers 202a to 202f and 202 and sacrificial layers 204a to 204g and 204. The structure layer STS3 may be a stacking structure layer. According to exemplary embodiments of the inventive concept, the interlayer insulating layers 202 may be formed of an oxide-based material such as a silicon oxide ($SiO_2$), a silicon carbonate (SiOC), or a silicon oxyfluoride (SiOF). The sacrificial layers 204 may have different etch rates with respect to the interlayer insulating layer 202 and may be formed of a material that may be easily removed by a wet etching process. For example, the sacrificial layers 204 may be formed of a nitride-based material such as a silicon nitride SiN or a silicon boron nitride (SiBN).

The interlayer insulating layers 202 and the sacrificial layers 204 may be formed through the CVD process, the PECVD process, or the spin coating process. The sacrificial layers 204 are removed through a subsequent process and may provide a horizontal space in which the GSL, the word lines, and the SSL are formed. For example, each of the GSL and the SSL is formed of one layer and the word lines may be formed of four layers. In this case, in the sacrificial layers 204, total six layers are stacked and, in the interlayer insulating layers 202, total seven layers may be stacked. However, the numbers of stacked layers in the interlayer insulating layers 202 and the sacrificial layers 204 are not limited thereto and there may be more than six or fewer than six stacked sacrificial layers 204 and/or more than seven or fewer than seven stacked insulating layers 202.

Figure 14A:
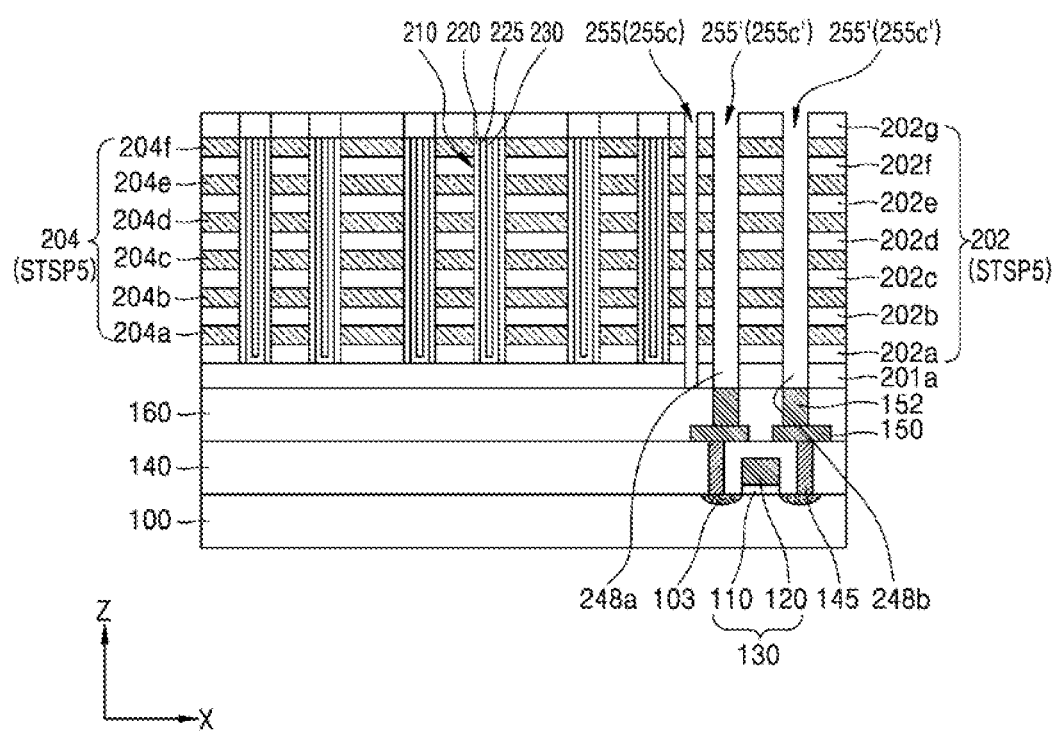
Figure 14B:
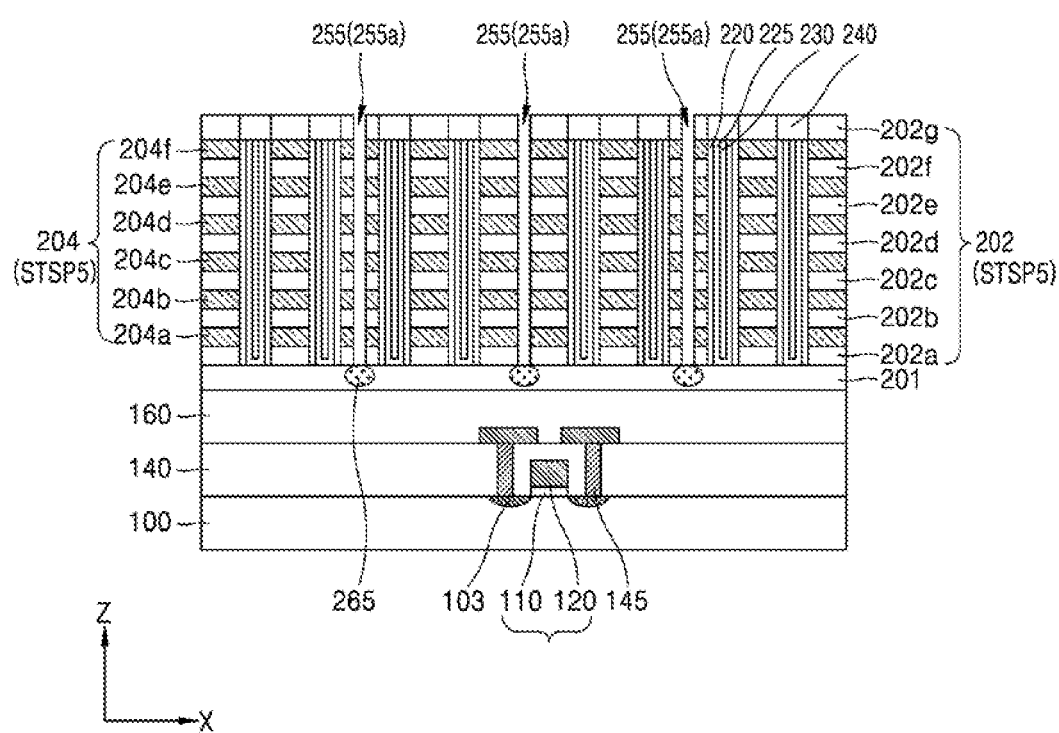

Referring to FIGS. 14A and 14B, a plurality of channel holes 210 that penetrate the structure layer STS3 may be formed. According to exemplary embodiments of the present inventive concept, the channel holes 210 may be formed by forming a hard mask on the uppermost interlayer insulating layer 202g and sequentially etching the interlayer insulating layers 202 and the sacrificial layers 204 through a dry etching process in which the hard mask is used as an etching mask. An upper surface of tie base layer 201 may be exposed by the channel holes 210.

The channel holes 210 may extend from the upper surface of the base layer 201 in the Z direction. The hard mask may be formed of, for example, a silicon or carbon-based spin-on hard mask (SOH) material or photoresist material and may be removed through an ashing and/or strip process after forming the channel holes 210.

A dielectric layer structure 220, a channel 225, and a buried layer pattern 230 may be formed on a side wall and/or a bottom surface of the channel hole 210. The dielectric layer structure 220 may be formed by sequentially stacking a tunnel insulating layer, a charge storage layer, and a blocking layer. The dielectric layer structure 220 may be formed through the CVD process, the PECVD process, the spin coating process, or the ALD process.

The channel 225 may be formed of polysilicon or amorphous silicon that is either doped with impurities or not doped with impurities. After forming the channel 225 by using polysilicon or amorphous silicon, polysilicon or amorphous silicon may be changed into single crystal silicon by performing thermal processing or laser beam irradiation on polysilicon or amorphous silicon. The buried layer pattern 230 may be formed of an insulating material such as a silicon oxide or a silicon nitride. The channel 225 and the buried layer pattern 230 may be formed through, for example, the CVD process, the PECVD process, the spin coating process, the PVD process, and the ALD process. The pad 240 that fills an upper portion of the channel hole 210 may be formed. The pad 240 may be formed of polysilicon or polysilicon doped with n-type impurities.

The trenches 255 and 255' may be formed by partially etching the interlayer insulating layers 202 and the sacrificial layers 204 among adjacent partial channel rows. By forming the trenches 255 and 255', the MCS may include the structure pattern STSP5 including the interlayer insulating layers 202a to 202g and the sacrificial layers 204a to 204f. The trenches 255 and 255' may extend in the X and Y directions. The trenches 255 and 255' may be plural and spaced apart from each other in the Y direction. The trenches 255 and 255 may be in the form of linear trenches that extend in the X and Y directions.

As illustrated in FIGS. 11A and 11B, 16, and 17, the trench 255 of the MCS may include a first trench 255a that extends in the X direction and the second trench 255b extending in the Y direction and having a cross portion 255c that crosses the first trench 255a. The first trench 255a and the second trench 255b of the MCS may be word line cut regions (or gate line cut regions). In FIG. 16, reference numeral 272 may be a trench for forming a ground selection line.

The trench 255' of the PCS may include the first peripheral trench 255a' that extends in the X direction and the second peripheral trench 255b' extending in the Y direction and having the cross portion 255c' that crosses the first peripheral trench 255a'.

The trench 255 and the peripheral trench 255' penetrate the interlayer insulating layers 202, the sacrificial layers 204, and the base layer 201 at the cross portions 255c and 255c' and form a penetration portion 258a and a peripheral penetration portion 258b.

The impurity region 265 may be formed in the upper portion of the base pattern 201a exposed by the first trench 255a. For example, the impurity region 265 may be formed by performing an ion implantation process and implanting n-type impurities through the first trench 255a. The impurity region 265 may be formed after forming the gate fines in a subsequent process.

Figure 15A:
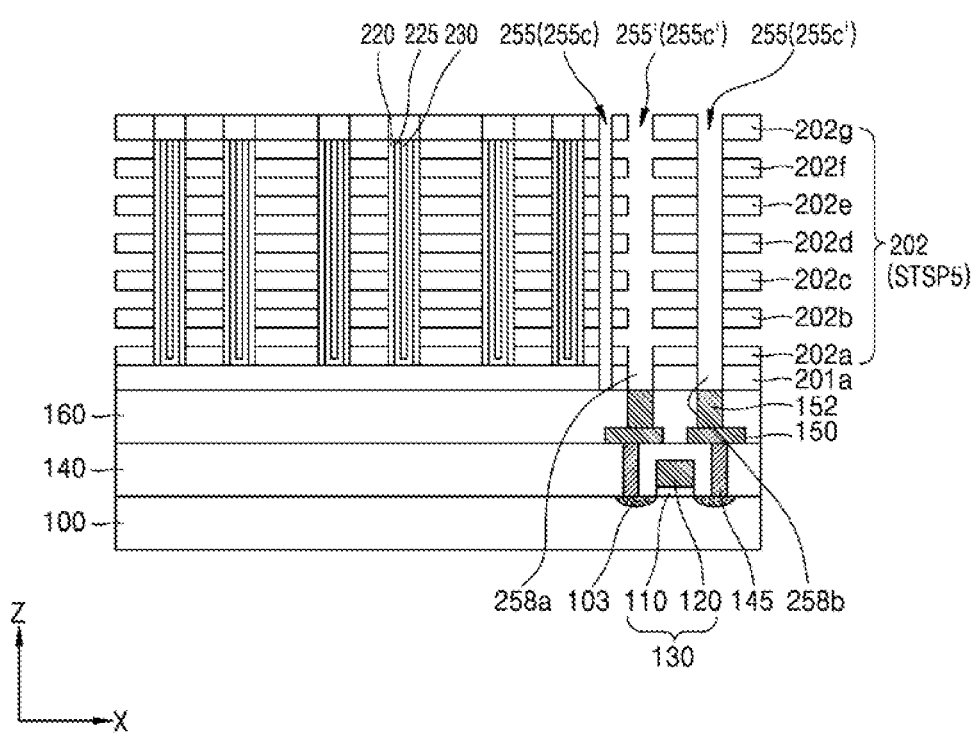
Figure 15B:
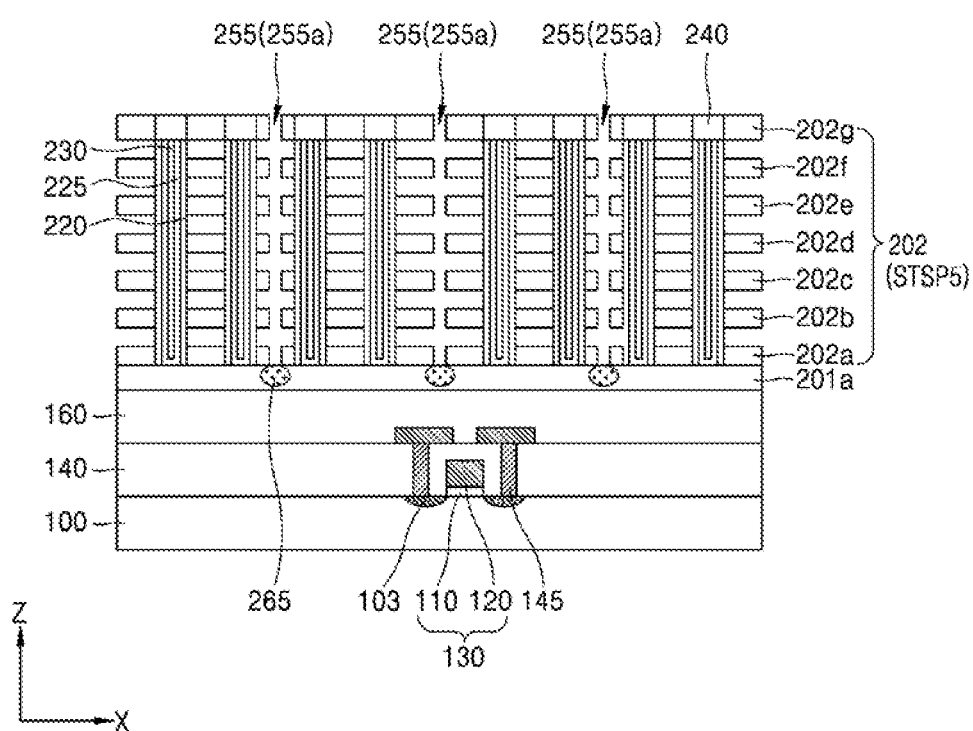

Referring to FIGS. 15A and 15B, the sacrificial layers 204 of which side walls are exposed may be removed by the trench 255 and the peripheral trench 255'. According to exemplary embodiments of the present inventive concept, the sacrificial layer 204 may be removed through a wet etching process in which etch solution (e.g. etchant) having etch selectivity is used for etching a silicon nitride. For example, acid solution such as phosphoric-acid or sulphuric acid may be used as the etch solution. When the sacrificial layers 204 are removed, a gap 257 may be formed between the interlayer insulating layers 202 and a portion of an external wall of the dielectric layer structure 220 may be exposed by the gap 257.

As illustrated in FIGS. 11A and 11B, the gate lines 260 are formed in the gap 257. The sacrificial layers 204 may be changed into the gate lines 260. The gate lines 260 may be formed on the side walls of the exposed dielectric layer structure 220, surfaces of the interlayer insulating layer 202, and an upper surface of the exposed base pattern 201a. The gate lines 260 configure the structure pattern STSP6 as described above.

The separation pattern 270 that fills the trench 255 may be formed. The upper contact plugs 244a and 244b and the upper wiring layer 293 may be simultaneously formed in the peripheral separation trench 255' and the peripheral penetration portion 258b that are provided on the PCS.

While exemplary embodiments of the inventive concept have been particularly shown and described with reference to the figures, it will be understood that various changes in form and details may be made therein without departing from the spirit and scope of the disclosure.

What is claimed is:
1. A semiconductor device, comprising:
a base pattern on the substrate, the base pattern including a penetration portion for penetrating the base pattern; and
a structure pattern on the base pattern, the structure pattern including a first trench extending in a first direction, and a second trench having a cross portion connected to the first trench and extending in a second direction that is perpendicular to the first direction;
wherein the penetration portion corresponds the cross portion that crosses the first trench and the second trench, and wherein a width of the penetration portion is the same as a width of the first trench and a width of the second trench.

2. The semiconductor device of claim 1, wherein the width of the penetration portion is the same as the width of the first trench in the second direction.

3. The semiconductor device of claim 1, wherein the width of the penetration portion is the same as the width of the second trench in the first direction.

4. The semiconductor device of claim 1, further comprising a wiring layer buried in the penetration portion, the first trench and second trench.

5. The semiconductor device of claim 1, wherein the second trench is connected to the first trench to form a T-shape, and the cross portion of the second trench corresponds to a point where the first trench contacts the second trench.

6. The semiconductor device of claim 1, wherein the base pattern comprises a polysilicon layer, and wherein the structure pattern is a stacked structure layer, and the stack structure includes a first material layer and a second material layer that are alternately stacked, the first material layer and the second material layer having different etch rates from each other.

7. The semiconductor device of claim 1, wherein the base pattern comprises a polysilicon layer, and wherein the structure pattern comprises an insulating structure layer including at least one insulating layer.

8. The semiconductor device of claim 1, wherein a bottom surface of the first trench is the same level as a bottom surface of the second trench.

9. The semiconductor device of claim 1, wherein the structure pattern comprises a first structure pattern that extends in the first direction and a plurality of second structure patterns spaced a pan from each other by the second trench in the first direction.

10. A semiconductor dev ice, comprising:
a lower wiring structure including a lower wiring layer;
a base pattern on the lower wiring structure, the base pattern including a penetration portion for penetrating the base pattern;
a structure pattern on the base pattern, the structure pattern including a first trench extending in a first direction on the lower wiring structure, and a second trench having a cross portion connected to the first trench and extending in a second direction that is perpendicular to the first direction; and
an upper wiring structure including a contact plug and an upper wiring layer, the contact plug connected to the lower wiring layer through the penetration portion and the upper wiring layer connected to the contact plug,
wherein the penetration portion corresponds the cross portion that crosses the first trench and the second trench, and
wherein a width of the penetration portion is the same as a width of the first trench and a width of the second trench.

11. The semiconductor device of claim 10, wherein the width of the penetration portion is the same as the width of the first trench in the second direction.

12. The semiconductor device of claim 10, wherein the width of the penetration portion is the same as the width of the second trench in the first direction.

13. The semiconductor device of claim 10, wherein the base pattern comprises a polysilicon layer and the structure pattern comprises an insulating structure layer.

14. The semiconductor device of claim 10, wherein a bottom surface of the first trench is in a same level as a bottom surface of the second trench.

15. The semiconductor device of claim 10, wherein the structure pattern comprises a plurality of second trenches, wherein the plurality of second trenches comprise a plurality of cross portions connected to the first trench in the first direction, and wherein a plurality of penetration portions ate formed at the plurality of cross portions.

16. The semiconductor device of claim 10, wherein the upper wiring structure comprise a plurality of contact plugs, and wherein the plurality of contact plugs are electrically connected to the upper wiring layer that extends in the first direction or the second direction.

17. A semiconductor device, comprising:
a base pattern on a substrate, the base pattern including a penetration portion for penetrating the base pattern;
a structure layer on the base pattern including a plurality of interlayer insulating layers and a plurality of word lines between the interlayer insulating layers in a third direction perpendicular to the substrate;
a channel structure in a channel hole in the structure layer; and
a structure pattern including a first trench and a second trench, the first trench extending on the substrate in a first direction perpendicular to the third direction, the second trench having a cross portion connected to the first trench on the substrate in a second direction perpendicular to the first direction at one side of each of the interlayer insulating layers and word lines,
wherein the penetration portion corresponds the cross portion that crosses the first trench and the second trench, and
wherein a width of the penetration portion is the same as a width of the first trench and a width of the second trench.

18. The semiconductor device of claim 17, wherein the width of the penetration portion is the same as the width of the first trench in the second direction, and wherein the width of the penetration portion is the same as the width of the second trench in the first direction.

19. The semiconductor device of claim 17, further comprising a peripheral circuit structure including a lower wiring layer on the substrate, wherein the peripheral circuit structure includes a first peripheral trench corresponding to the first trench, a second peripheral trench corresponding to the second trench, and a peripheral penetration portion corresponding to the penetration portion.

20. The semiconductor device of claim 19, further comprising a contact plug and an upper wiring layer, the contact plug being connected to the lower wiring layer through the peripheral penetration portion and the upper wiring layer connected to the contract plug, and extending in the first direction or the second direction.

* * * * *